US008264298B2

(12) United States Patent
Kenington

(10) Patent No.: US 8,264,298 B2
(45) Date of Patent: Sep. 11, 2012

(54) FILTERING DEVICE AND A METHOD FOR FILTERING A SIGNAL

(75) Inventor: Peter Kenington, Chepstow (GB)

(73) Assignee: Unidyne, Inc., Wilmington, DE (US)

( * ) Notice: Subject to any disclaimer, the term of this patent is extended or adjusted under 35 U.S.C. 154(b) by 390 days.

(21) Appl. No.: 12/571,808

(22) Filed: Oct. 1, 2009

(65) Prior Publication Data
US 2011/0080229 A1 Apr. 7, 2011

(51) Int. Cl.
*H01P 5/16* (2006.01)
*H03H 7/54* (2006.01)
*H03H 7/46* (2006.01)
*H03H 9/64* (2006.01)
*H04B 1/50* (2006.01)
*H04B 1/10* (2006.01)

(52) U.S. Cl. ........ 333/126; 333/129; 333/132; 333/133; 455/78; 455/82; 455/213; 455/307; 370/278; 370/282

(58) Field of Classification Search ................. 333/117, 333/118, 124–129, 132–136, 175, 176, 185–187, 333/189, 193, 194; 455/78, 82, 212, 213, 455/296, 307; 370/201, 278, 282
See application file for complete search history.

(56) References Cited

U.S. PATENT DOCUMENTS

| | | | | |
|---|---|---|---|---|
| 3,587,009 | A * | 6/1971 | Kibler | 333/210 |
| 3,988,705 | A | 10/1976 | Drapac | |
| 4,292,607 | A * | 9/1981 | Goldie et al. | 333/24.1 |
| 4,538,123 | A * | 8/1985 | Mariani et al. | 333/208 |
| 4,694,266 | A * | 9/1987 | Wright | 333/196 |
| 4,963,945 | A * | 10/1990 | Cooper et al. | 455/307 |
| 5,065,453 | A * | 11/1991 | Thomas | 455/286 |
| 5,473,295 | A | 12/1995 | Turunen | |
| 5,721,521 | A * | 2/1998 | Drabeck et al. | 333/202 |
| 5,894,251 | A * | 4/1999 | Taguchi et al. | 333/193 |
| 6,201,457 | B1 * | 3/2001 | Hickernell | 333/193 |
| 6,374,094 | B1 * | 4/2002 | Zappala | 455/188.1 |

(Continued)

FOREIGN PATENT DOCUMENTS
EP 0 273 793 A1 * 7/1988
(Continued)

OTHER PUBLICATIONS
http://en.wikipedia.org/wiki/Duplexer; dated Jul. 28, 2009.
(Continued)

*Primary Examiner* — Barbara Summons
(74) *Attorney, Agent, or Firm* — Stephen H. Eland; Dann, Dorfman, Herrell & Skillman

(57) ABSTRACT

The present disclosure teaches a filtering device. The filtering device comprises a transforming unit, at least a first filtering element and a complementary filtering unit. The filtering device of the present disclosure allows an isolation of radio signals within a selected frequency band. Frequency bands closely-spaced to the selected frequency band may be suppressed. The present disclosure provides a reliable and almost identical response to temperature changes for the pass band within the selected frequency band and the stop bands closely-spaced to the selected frequency band. The filtering device withstands temperature changes without affecting a filtering performance different to the prior art. The present disclosure further provides a method for filtering an input signal as well as a computer program product for the manufacture of the filtering device and a computer program product for the carrying out of the method of filtering.

29 Claims, 15 Drawing Sheets

U.S. PATENT DOCUMENTS

| | | | |
|---|---|---|---|
| 6,768,396 B2 * | 7/2004 | Klee et al. ............... | 333/187 |
| 6,934,562 B1 * | 8/2005 | Wilding ............... | 455/562.1 |
| 7,038,557 B2 * | 5/2006 | Nakamura et al. ........... | 333/132 |
| 7,437,139 B2 * | 10/2008 | Lo et al. ............... | 455/340 |
| 8,013,690 B2 * | 9/2011 | Miyashiro ............... | 333/176 |
| 2006/0019611 A1 | 1/2006 | Mages | |
| 2006/0152304 A1 * | 7/2006 | Liang et al. ............... | 333/176 |
| 2009/0231058 A1 * | 9/2009 | Nishino et al. ............... | 333/118 |
| 2009/0289744 A1 | 11/2009 | Miyashiro | |
| 2011/0080229 A1 | 4/2011 | Kenington | |
| 2011/0080856 A1 * | 4/2011 | Kenington ............... | 370/278 |
| 2011/0081878 A1 * | 4/2011 | Kenington ............... | 455/213 |

FOREIGN PATENT DOCUMENTS

| | | | | |
|---|---|---|---|---|
| JP | 55-67201 | * | 5/1980 | ............... 333/28 R |
| JP | 63-206029 | * | 8/1988 | ............... 333/167 |
| JP | 9-2284075 | * | 10/1997 | |
| JP | 2007-208350 | * | 8/2007 | |
| WO | WO 2007/066426 A1 | * | 6/2007 | |

OTHER PUBLICATIONS http://en.wikipedia.org/wiki/Diplexer; dated Jul. 28, 2009.

http://rfsolutions.com/duplex.htm; dated 1996-2005.

Wen et al, Suppression of Reflection Coefficients of Surface Acoustic Wave Filters Using Quadrature Hybrids; IEEE Transactions on Ultrasonics, Ferroelectrics and Frequency Control; ISSN 0885-3010, Oct. 2006, V. 53, No. 10, pp. 1912-1917.

Jachowski, "Passive Enhancement of Resonator Q in Microwave Notch Filters", 2004 IEEE MTT-S Digest, pp. 1315-1318.

* cited by examiner

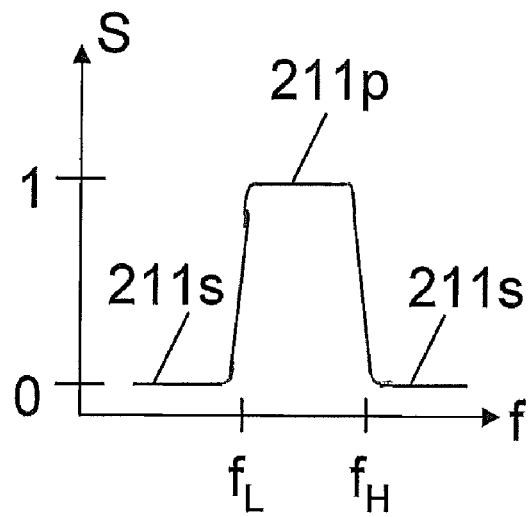
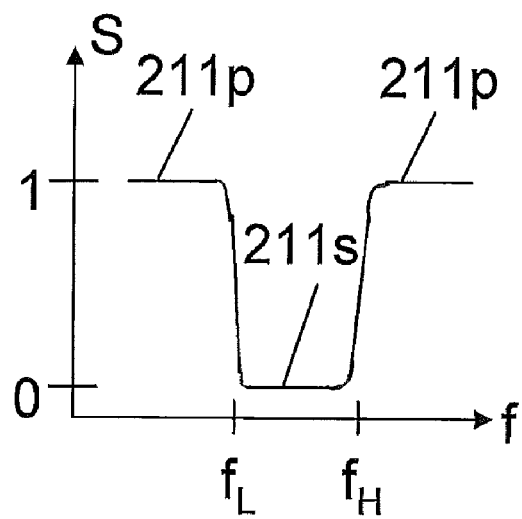
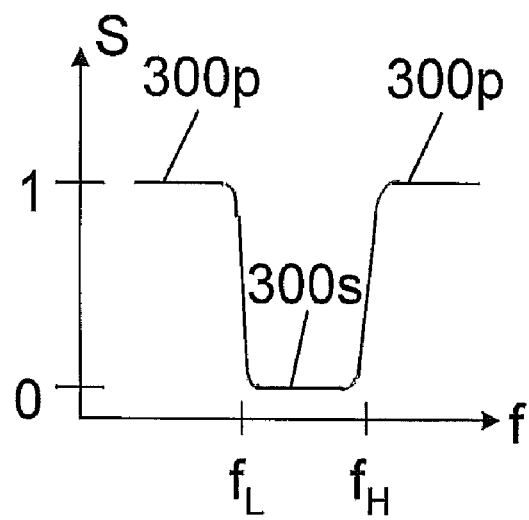
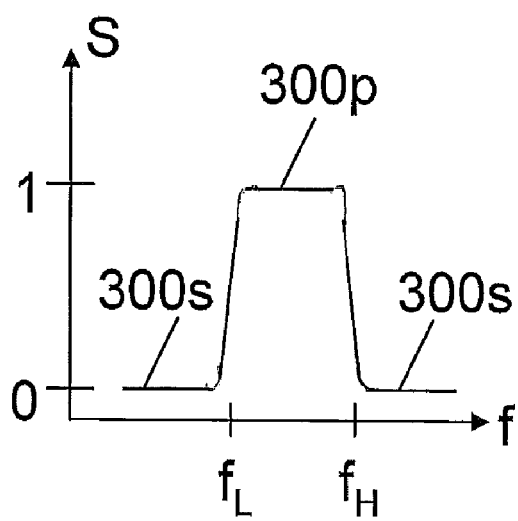
Figure 1f                Figure 1g

FILTERING DEVICE AND A METHOD FOR FILTERING A SIGNAL

CROSS REFERENCE TO OTHER APPLICATIONS

The present application is related to U.S. patent application Ser. No. 12/571,696 entitled: "Filtering Device for Filtering RF Signals and Method for Filtering RF Signals", filed Oct. 1, 2009 and U.S. patent application Ser. No. 12/571,727 entitled: "Duplexer and Method for Separating a Transmit Signal and a Receive Signal", filed Oct. 1, 2009. The entire disclosures of each of the foregoing applications are incorporated herein by reference.

FIELD OF THE INVENTION

The field of the present invention relates to a filtering device and a method for filtering signals with temperature tracking across closely-spaced frequency bands.

BACKGROUND OF THE INVENTION

There is a need in the field of radio frequency (RF) technology to provide a filtering device that is adapted to reliably isolate input signals in closely-spaced frequency bands even when the filtering device is exposed to temperature changes. This is a requirement in modern telecommunication systems in which one needs to separate two or more input signals that are closely-spaced in frequency. The filtering device needs to have a pass band for a first radio signal in a first frequency band and a stop band for a second frequency in a second frequency band. The second frequency band is closely-spaced in frequency to the first frequency band.

In the prior art such filtering characteristics were achieved by filtering the input signal using a band-pass filter and forwarding the output of the band-pass filter to a band-stop filter such that the band-stop filter would suppress an unwanted frequency band closely-spaced to a wanted frequency band. As the band-pass filter is typically different in design from the band-stop filter, a temperature tracking of the band-stop filter may be substantially different. When filtering closely-spaced ones of the frequency bands with a cascade of the band-pass filter and the band-stop filter, it is of interest for a pass band of the band-pass filter and a pass band of the band-stop filter not to impinge on each other. If the pass band of the band-pass filter and the pass band of the band-stop filter are overlapping, i.e. impinging, the input signals could pass the combined band-pass filter and band-stop filter at one or more unwanted frequencies.

Another alternative is to cascade a first band-pass filter and a second band-pass filter. A 3 dB point of the first band-pass filter could coincide with a 3 dB point of the second band-pass filter and result in a 6 dB attenuation at frequencies where only 3 dB attenuation is desired or permitted. Likewise other points in the pass-bands of the first band-pass filter and the second first band-pass filter will result in an attenuation which is twice as great. This "double" attenuation could result in a marked increase in error vector magnitude (EVM) for the signals passing through the cascaded band pass and in consequence may exceed a threshold for the EVM in, for example, 3GPP standards.

Quite frequently the temperature tracking, i.e. a response to temperature changes, of the band-pass filter is different from the temperature tracking of a band-stop filter. Consequently a combination of the band-pass filter and the band-stop filter, as known in the prior art, may generate an overlapping of the pass band of the band-pass filter and the pass band of the band-stop filter when being exposed to the temperature changes. In a radio system the filtering elements are normally exposed to temperature changes. Such temperature changes may stem, for example, from an exposure to variable environmental conditions and/or heat generated in the radio system, but are not limited thereto. There is a need for the filtering device to be adapted to separate or isolate closely-spaced ones of the frequency bands when the filtering device is exposed to the temperature changes.

U.S. Pat. No. 5,473,295 to LK-Products OY Finland teaches a SAW filter being coupled to a receiver (Rx) branch of a duplex filter. The provision of the SAW filter increases the stop band attenuation of the duplex filter. The SAW filter is configured as a notch filter. The SAW filter improves the rejection of a band-pass filter in a mobile radio telephone.

Jiguo Wen, et al. disclose in "Suppression of Reflection Coefficients of Surface Acoustic Wave Filters using Quadrature Hybrids", published in IEEE transactions on Ultrasonics, Ferroelectrics and Frequency Control, Volume 53, issue 10, pages 1912-1917, the use of a quadrature hybrid to improve the input and output matching characteristics of a pair of identical SAW filters. The Wen paper uses two quadrature hybrids.

SUMMARY OF THE INVENTION

The present disclosure teaches a filtering device. The filtering device comprises a transformation unit, a first filtering element and a complementary filtering unit. The first filtering element has a first filtering characteristic with at least a first pass band and at least a first stop band. The complementary filtering unit has a complementary filtering characteristic. The complementary filtering characteristic comprises at least one complementary pass band and at least one complementary stop band. The transforming unit is adapted to substantially transform at least the first filtering characteristic of the first filtering element into an effective filtering characteristic of the filtering device. The effective filtering characteristic and the complementary filtering characteristic are closely spaced in frequency and combine to provide an overall filtering characteristic of the filtering device. In operation the overall filtering characteristic affects an output signal at an output of the filtering device. The output signal is generated in response to an input signal at an input of the filtering device.

The term "closely-spaced frequency band" or "closely-spaced in frequency" used in this disclosure shall be understood as referring to a first frequency band and a second frequency band being separated in frequency such that a band of separation between the first and second frequency band is considerably smaller than a width of the first frequency band or a width of the second frequency band. For example in mobile communications the first frequency band may be, for example, 35 MHz wide and the second frequency band may be 35 MHz wide. A width of separation between the receive band Rx and the transmit band Tx typically lies in the range of 10 MHz in modern protocols for mobile communication. Therefore the transmit signal Tx and the receive signal Rx are closely-spaced in frequency in the modern protocols for mobile communication.

The term "closely spaced filtering characteristics" used in this disclosure shall be understood as referring to a first filtering characteristic and a second filtering characteristic. The first filtering characteristic comprises at least a first pass band and at least a first stop band. The second filtering characteristic comprises at least a second pass band and at least a second stop band. The first filtering characteristic is considered to be "closely spaced" to the second filtering characteristic if at least one of the at least one first stop band or the at least one first pass band is closely spaced to at least one of the at least one second stop band or the at least one second pass band.

A response to temperature changes of the first filtering element is substantially identical to a response to temperature changes of the complementary filtering unit. The transforming is not known in the prior art. The use of the transforming unit in conjunction with near-identical filters, i.e. the first filtering element and the complementary filtering unit for temperature tracking purposes, is not known in the prior art. The transforming unit facilitates ensuring that the response of the first filtering element and the complementary filtering element to temperature changes is substantially identical.

The transforming unit may be implemented as a circulator.

The transforming unit may comprise an analogue quadrature splitter and a second filtering element. The use of the analogue quadrature splitter as the transforming unit is not known in the prior art. The analogue quadrature splitter is adapted to split an input signal into an in-phase component and a quadrature component. The second filtering element has a second filtering characteristic. The second filtering characteristic comprises at least a second pass band and at least a second stop band. The transforming unit is adapted to substantially transform at least one of the at least one first pass band and the at least one second pass band into the at least one effective stop band. The transforming unit is further adapted to substantially transform at least one of the at least one first stop band and the at least one second stop band into the at least one effective pass band.

The present disclosure further teaches a cascading of the filtering device. The cascading comprises using more than one of the filtering devices such that an output of one of the more than one filtering devices is forwarded as an input to another one of the cascaded filtering devices. A trade-off of the cascading of the filtering device may be an increased insertion loss. Therefore a compromise between an increased filtering performance and a penalty in the increased insertion loss needs to be found.

The present disclosure further teaches a method for filtering an input signal. The method comprises providing the input signal. The method further comprises filtering the input signal according to a complementary filtering characteristic. The complementary filtering characteristic has at least one complementary pass band and at least one complementary stop band. The method further comprises an action of substantially transforming a first filtering characteristic with at least a first pass band and at least a first stop band into an effective filtering characteristic. The effective filtering characteristic and the complementary filtering characteristic are closely spaced in frequency and combine to an overall filtering characteristic. The order of the actions that are performed during the execution of the method may differ from the order in which the actions are mentioned in the claims.

It will be appreciated by a person skilled in the art that the transforming of the filtering characteristics will lead to an addition of a ripple on one or more of the transformed pass bands and/or the transformed stop bands. The additional ripple is not shown in the figures for the sake of clarity. The term "substantially transforming" as used herein should be construed as the transforming with or without the additional ripple on one or more of the transformed pass bands and/or the transformed stop bands.

The present disclosure further teaches a computer program product embodied on a computer-readable medium and the computer-readable medium comprising executable instructions for the execution of a manufacture of a filtering device. The filtering device comprises a transforming unit, a first filtering element and a complementary filtering unit. The first filtering element has a first filtering characteristic with at least a first pass band and at least a first stop band. The complementary filtering unit has a complementary filtering characteristic comprising at least one complementary pass band and at least one complementary stop band. The transforming unit is adapted to substantially transform at least the first filtering characteristic of the first filtering element into an effective filtering characteristic. The effective filtering characteristic and the complementary filtering characteristic are closely spaced in frequency and combine to an overall filtering characteristic of the filtering device. The overall filtering characteristic affects an output signal at an output of the filtering device in response to an input signal at an input of the filtering device.

The present disclosure teaches a computer program product embodied on a computer-readable medium and the computer-readable medium comprising executable instructions for the execution of a method for filtering an input signal. The method comprises an action of providing an input signal. The method further comprises a filtering of the input signal according to a complementary filtering characteristic. The complementary filtering characteristic comprises at least one complementary pass band and at least one complementary stop band. The method further comprises a substantially transforming of a first filtering characteristic with at least a first pass band and at least a first stop band into an effective filtering characteristic. The effective filtering characteristic and the complementary filtering characteristic are closely spaced in frequency and combine to produce an overall filtering characteristic.

BRIEF DESCRIPTION OF THE DRAWINGS

FIG. 1b shows a variant of the filtering device of FIG. 1a.
FIG. 1f shows a transformation of a band pass into an effective band stop.
FIG. 1g shows a transformation of a band stop into an effective band pass.

DETAILED DESCRIPTION OF THE INVENTION

For a better understanding of the present disclosure reference shall now be made to an aspect of the present disclosure, examples of which are illustrated in the accompanying drawings. It will be understood that the embodiments and aspects of the invention described herein are only examples and do not limit the protective scope of the claims in any way. The invention is defined by the claims and their equivalents. It will be also understood that features of one aspect can be combined with features of different aspects.

Figure 1A:
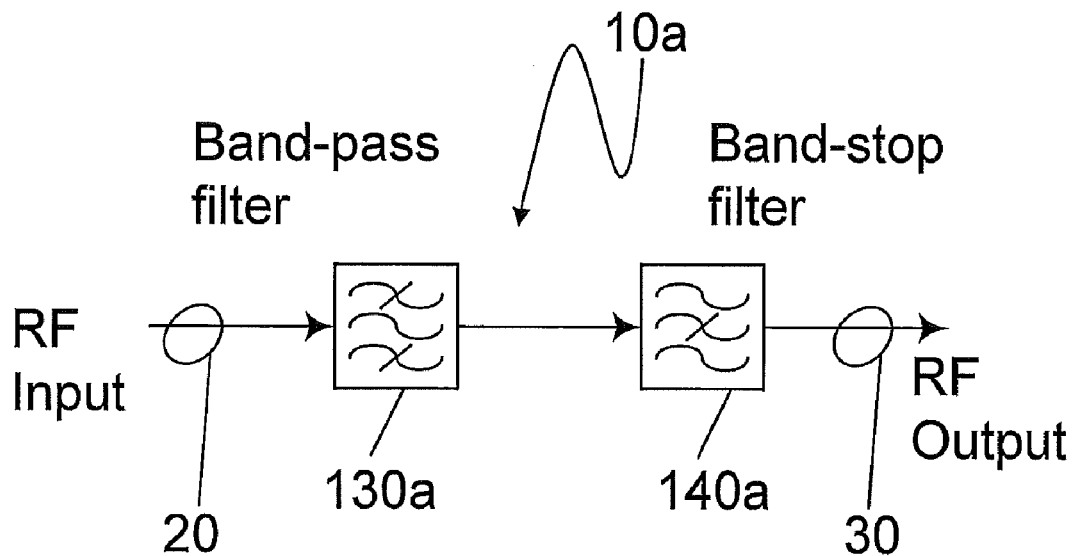
FIG. 1a shows a filtering device according to the prior art.

FIG. 1a shows a first variant of a filtering device 10a according to the prior art. The input signal 20 is forwarded to a first filtering element 130a. The input signal 20 comprises a radio frequency (RF) signal. The first filtering element 130a comprises a band-pass filter with a relatively slow roll-off or an inadequate level of signal attenuation outside of its pass band (often called: "ultimate attenuation"). An output of the first filtering element 130a is forwarded to a complementary filtering element 140a. The complementary filtering element 140a comprises a band stop filter, for example with a relatively steep transition between a pass band and a stop band of the band stop filter. If one wishes to isolate two RF signals, for example a transmit signal Tx and a receive signal Rx, the first filtering element 130a may be selected such that the wanted signal, for example the Tx signal, is in a frequency band within a first pass band 131p (see FIG. 1d) of the first filtering element 130a. FIG. 1d also shows first stop bands and second stop bands 131s of the first filtering element 130a. The complementary filtering element 140a (see FIG. 1e) may be chosen such that a signal component being closely-spaced in frequency to the wanted signal, in our example closely-spaced to the Tx signal, is suppressed by a stop band 141s of the complementary filtering element. FIG. 1e also shows first pass bands and second pass bands 141p of the complementary filtering element 140a.

The first filtering element 130a in FIG. 1a being the band-pass filter is of a substantially different design than the complementary filtering element 140a being the band-stop filter. It is to be understood that the band-stop filter of the complementary filtering element 140a may be, in an extreme case, a notch filter. Even if the first filtering element 130a and the complementary filtering element 140a are fabricated using similar (or even identical) technologies, there is no guarantee that the first filtering element 130a and the complementary filtering element 140a will respond in a sufficiently identical manner to a change in temperature.

At high frequencies, such as 1-3 GHz, even a very small difference in a response to temperature changes of the first filtering element 130a and the complementary filtering element 140a may result in, for example, the stop band 141s of the complementary filtering element 140a impinging on the pass-band 131p of the first filtering element 130a. The impinging leads to a stopping of at least parts of a wanted signal within the pass-band 211p of the first filtering element. Alternatively, a gap may be formed between the pass-band 131p of the first filtering element 130a and the stop band 141p of the complementary filtering element 140a, leaving only the relatively slow roll-off of the first filtering element 130a at the edge of the pass-band 131p. The relatively slow roll-off or the "ultimate attenuation" of the first filtering element 130a may not be sufficient to separate the transmit band Tx from the receive band Rx. A reason why the first filtering element 130a and the complementary filtering element 140a are not identically responding to the change in temperature is that the first filtering element 130a and the complementary filtering element 140a are fundamentally different types of filtering elements. In the example of FIG. 1a the first filtering element 130a comprises a band-pass filter (band pass) and the complementary filtering element 140a comprises a band-stop filter (band stop, also know as 'band-reject' or 'notch').

The first filtering element 130a and the complementary filtering element 140a are typically designed such that poles and zeros of a transfer function of the first filtering element 130a and the complementary filtering element 140a are chosen to provide a combined filtering characteristic. The combined filtering characteristic of the first filtering element 130a and the complementary filtering element 140a will deteriorate with the change in temperature as a response to the change in temperature is different for the first filtering element 130a and the complementary filtering element 140a. A difference in the response to the change in temperature may only amount to a small fraction of a percent with respect to a centre frequency for the first filtering element 130a and a centre frequency of the complementary filtering element 140a. This difference in the response to the change in temperature may be sufficient to cause a substantial difference in the combined filtering characteristic being exposed to the temperature change.

Figure 1B:
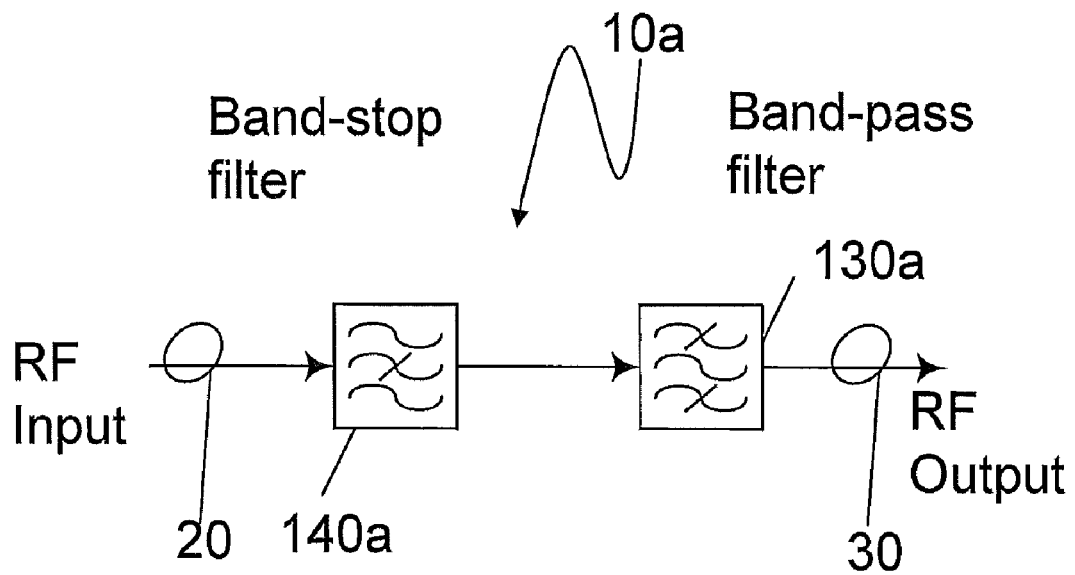

FIG. 1b shows a variant of the filter device 10a as shown in FIG. 1a. The first filtering element 130a has changed place with the complementary filtering element 140a. The output signal 30 of the filtering device 10a of FIG. 1b will be identical with the output of the filtering device 10a of FIG. 1a, as the first filtering element 130a and the complementary filtering element 140a may be interchanged.

Figure 1C:
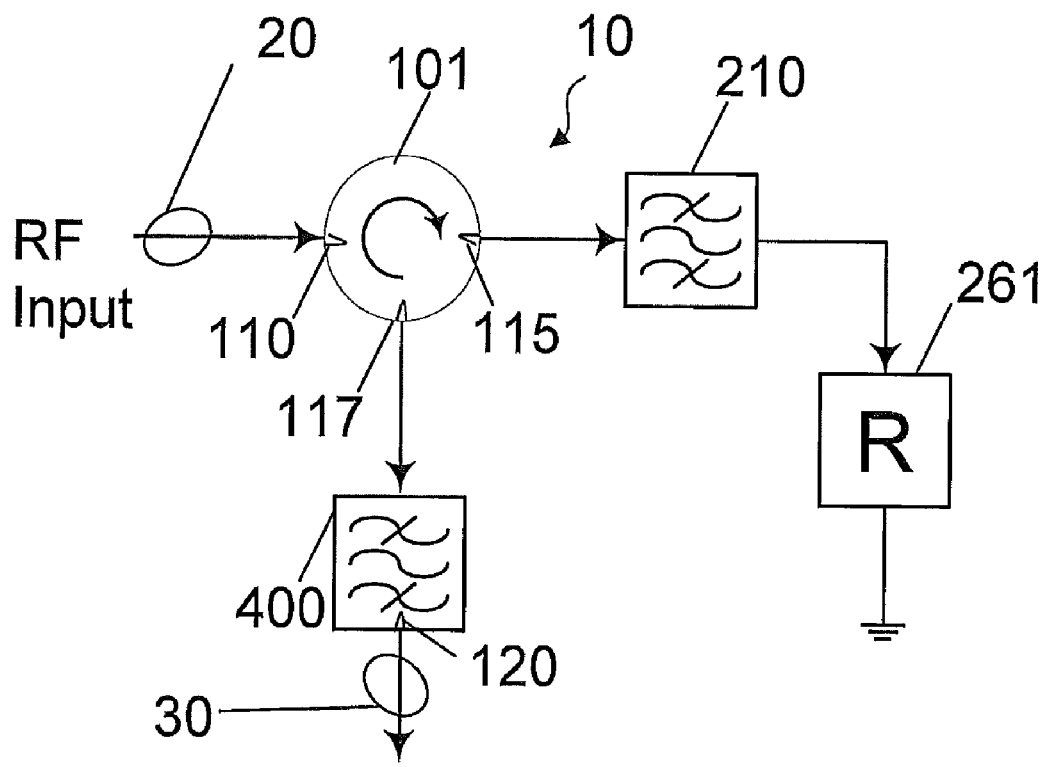
FIG. 1c shows a filtering device according to the present disclosure.
Figure 1D:
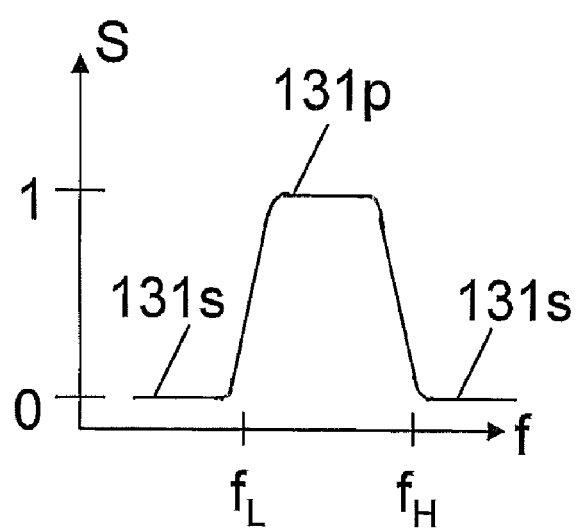
FIG. 1d shows the filtering characteristics of a first filtering element.
Figure 1E:
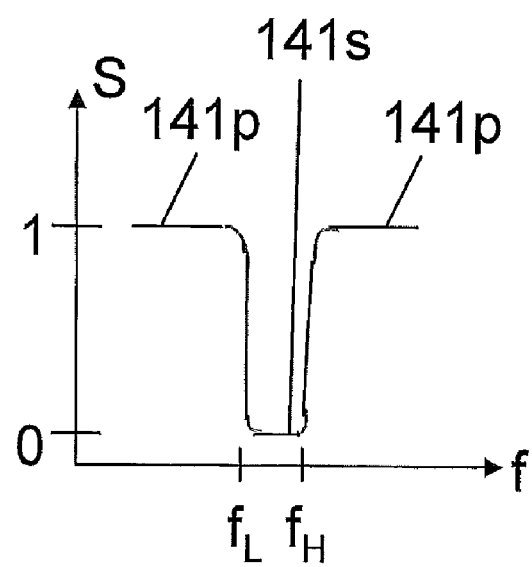
FIG. 1e shows the filtering characteristics of a complementary filtering element.

FIG. 1c shows a filtering device 10 according to the present disclosure. The input signal 20 is forwarded to an input 110 of the filtering device 10. In FIG. 1c the input 110 of the filtering device 10 is also an input of the transforming unit 101. The transforming unit 101 is a circulator. The circulator 101 forwards signals from the input 110 to a forward port 115. Any reflection back into the forward port 115 will not reach the input 110 of the circulator 101, but will be forwarded to a reflection port 117 of the circulator.

Downstream of the forward port 115 there is a first filtering element 210. The first filtering element 210 in FIG. 1c is in the form of a band-pass filter. The band-pass characteristic of the first filtering element 210 comprises a first pass-band 211p and at least one first stop-band 211s (see FIG. 1f). There may be more than one first pass-band 211p. Any signal components within the first pass-band 211p of the first filtering element 210 will be forwarded to a first load 261 and terminated in the first load 261. Any signal component reaching the first filtering element 210 in a frequency band within the at least one first stop band 211s of the first filtering element 210 will be reflected back to the forward port 115 of the circulator. The reflected signal components will be forwarded to the reflection port 117 of the circulator. The circulator causes a transformation of filtering characteristics of the first filtering element 210 as will be explained later. A complementary filtering unit 400 will allow RF signal components within a complementary pass-band 400p (see FIG. 3) of the complementary filtering unit 400 to reach the output 120 of the filtering device 10.

The present disclosure provides a filtering device 10 with a substantially identical response to the temperature changes for the first filtering element 210 and the complementary filtering element 400. The present disclosure provides an output signal 30 of the filtering device 10 comprising the band-pass filter characteristics of the first filtering element 210 and the complementary filtering element 400 without the difficulties in different responses to the temperature changes as in the prior art.

If one wishes to combine a band-pass filtering characteristic with a band-stop filtering characteristic, one may use the first filtering element 210 with the first pass band 211$p$ in a frequency band corresponding to the band stop filtering characteristic of the combined filtering characteristic in the filtering device 10. The first pass band 211$p$ will be substantially transformed into an effective stop-band 300$s$ (as will be explained later). The complementary filtering unit 400 may be chosen such that the complementary pass-band 400$p$, as will be explained later, corresponds to an effective pass-band within the combined filtering characteristic.

FIG. 1$f$ shows a transformation of the band-pass filtering characteristic (band pass) comprising first stop bands 211$s$ and a first pass band 211$p$. The band-pass characteristics of the upper half of FIG. 1$f$ are substantially transformed into a band-stop characteristic, as displayed in the lower half of FIG. 1$f$ when used in the filtering device 10, more precisely the transforming unit 101. The band stop comprises the effective pass bands 300$p$ and the effective stop band 300$s$.

FIG. 1$g$ shows a transformation of a band-stop filtering characteristic (band stop), as displayed in the upper half, into a band-pass characteristic, as displayed in the lower half of FIG. 1$g$, when used with the filtering device 10, more precisely the transforming unit 101 of the present disclosure. The band pass comprises the effective pass band 300$p$ and the effective stop bands 300$s$.

FIG. 2$a$ shows a variant of the transforming unit 101 according to the present disclosure. The transforming unit 101 comprises an analogue quadrature splitter 100. The analogue quadrature splitter 100 comprises an RF input 110 to receive the input signal 20. The analogue quadrature splitter 100 is adapted to split the input signal 20 into an in-phase component I at an in-phase output I of the analogue quadrature splitter 100 and into a quadrature component Q of the input signal 20 at a quadrature output Q. The power within the input signal 20 is equally distributed between the in-phase output I and the quadrature output Q of the analogue quadrature splitter 100, i.e. into the in-phase component I and the quadrature component Q. The analogue quadrature splitter also comprises an RF output 120. In a typical application of the analogue quadrature splitter 100, the RF output 120 would be terminated to a defined load, for example 50 Ohms. According to the present disclosure the output 120 is not terminated. From the analogue quadrature splitter 100 the in-phase component I and the quadrature component Q each reach respective impedance matching networks 252 and 251. The quadrature component Q reaches the first impedance matching network 251. The in-phase component I reaches the second impedance matching network 252. The first impedance matching network 251 and the second impedance matching network 252 are optional and may be required if filtering elements 410, 420 connected to the transforming unit 101 require the RF signal to be matched to an appropriate load to maximise the transfer of signal power from the analogue quadrature splitter to the filtering elements.

It is to be understood that the analogue quadrature splitter 100 provides a high level of isolation between the in-phase component I and the quadrature component Q. The isolation between the in-phase component I and the quadrature component Q may, for example, be in the range of −30 dB or more. The analogue quadrature splitter 100 may be fabricated in strip line technology, microstrip technology, as a lumped-element equivalent, as a transformer-based hybrid (i.e. a quadrature hybrid), etc. Other continuous-time (analogue) methods of achieving quadrature splitting may also be applicable. It is convenient to implement the analogue quadrature splitter 100 in strip line technology if the input signal 20 is of a power level of several watts up to several hundreds of watts. It is also possible to implement the analogue quadrature splitter using lumped elements. The lumped element will typically not withstand as high a power level as does the analogue quadrature splitter 100 when implemented in strip line technology, but may be smaller in size.

The transforming unit 101 in FIG. 2$a$ comprises a first low-power filtering element 410 and a second low-power filtering element 420. FIG. 2$b$ shows the corresponding transfer functions $S_{1st\,filtering\,element}$ and $S_{2nd\,filtering\,element}$. A first pass band 411$p$ of the first filtering element 410 extends between a first low frequency $f_{L1}$ and a first high frequency $f_{H1}$. A second pass band 421$p$ of the second low-power filtering element 420 extends between a second low frequency $f_{L2}$ and a second high frequency $f_{H2}$.

Referring back to FIG. 2$a$, an RF signal within the first pass band 411$p$ of the first low-power filtering element 410 is terminated in a first load 261. Likewise the RF signal within the second pass band 421$p$ is forwarded into a second load 262. A portion of the RF signal in a first stop band 411$s$ is rejected at the first filtering element 410 and reflected back into the analogue quadrature splitter 100. There could be more than one first stop band 411$s$ within the filtering characteristics of the first low-power filtering element 410. The RF signals within a second stop band 421$s$ of the second low-power filtering element 420 are not forwarded to the load 262 but reflected back into the in-phase input I of the analogue quadrature splitter 100. As mentioned previously, the second low-power filtering element 420 may also comprise more than one of the second stop bands 421$s$. Signal components reflected back to the analogue quadrature splitter 100 from the first low-power filtering element 410 and/or the second low-power filtering element 420 will be shaped according to an effective filtering characteristic as explained in connection with FIGS. 1$f$-1$g$. The stop band(s) 411$s$ of the first low-power filtering element 410 will be transformed into effective pass band(s) (analogue to the transformation of the stop band(s) 211$s$ into the effective pass band(s) 300$p$ in FIGS. 1$f$ and 1$g$). The previous pass band(s) of the first low-power filtering element 410 and/or the second low-power filtering element 420 will be transformed into effective stop band(s) (analogous to the transformation of the pass band(s) 211$p$ into the effective stop band(s) 300$s$ in FIGS. 1$f$ and 1$g$).

FIG. 2$c$ shows an aspect of the transforming unit 101, in which the first filtering element 410 and the second filtering element 420 are provided on the same substrate and/or in an identical package (or in the same package). Therefore a temperature tracking of the first filtering element 410 and the second filtering element 420 will be substantially identical.

FIG. 2$d$ shows an example of the transforming unit 101 according to the present disclosure. In FIG. 2$d$ there are auxiliary impedance matching networks 271 present for each one of the in-phase component I and the quadrature component Q, in addition to the aspects disclosed previously. The auxiliary matching networks 271 help improving the filtering characteristics of the first filtering element 410 and the second filtering element 420 within the effective filtering characteristic. The effective filtering characteristic affects the output signal 30 of the filtering device 10. The output signal 30 is generated in response to the input signal 20 present at the input 110 of the transforming unit 101. The auxiliary matching networks 271 are to improve the filtering characteristics within a stop band 411$s$ of the first filtering characteristic and/or a stop band 421$s$ of the second filtering characteristic of the second filtering element 420. In a region of transition from a pass band 411*p*, 421*p* into a stop band 411*s*, 421*s* group-delay and/or phase characteristics are typically poor in filtering devices known in the prior art. Likewise the group delay and/or phase characteristics are typically poor within the stop bands 211*s* of SAW filtering elements that may be used for constructing the first filtering element 210, 410, the second filtering element 420 and the complementary filtering unit 400. One finds extreme variations of the group delay and/or the phase characteristics within regions of transition and the stop band regions 211*s*, 411*s*, 421*s*.

The stop bands 211*s*, 411*s*, 421*s* are transformed into effective pass bands 300*p* by the transforming unit 101. Therefore it is of interest to smooth the group delay and/or phase characteristics within regions of transition and/or the stop bands 211*s*, 411*s*, 421*s* of the first filtering element 210, 410 and/or the second filtering element 420. If the region of transition and the stop bands 211*s*, 411*s*, 421*s* of the first filtering element 210, 410 and/or the second filtering element 420 are kept smooth with respect to group delay and/or phase, the group delay and/or the phase will appear smooth within the effective filtering characteristic. It may be of interest to provide the auxiliary matching networks 271 exhibiting a lower impedance than the first filtering element 210, 410 within the stop bands 211*s*, 411*s* and/or the second filtering element 420 within the stop band 421*s*. Typically an impedance of the auxiliary matching networks 271 dominates a stop band impedance of the first filtering element 210, 410 and the second filtering element 420. As a result well behaved group delay and/or phase characteristics of the auxiliary impedance 271 will dominate the group delay and/or phase characteristics of the effective pass band 300*p* of the transforming unit 101.

Figure 2A:
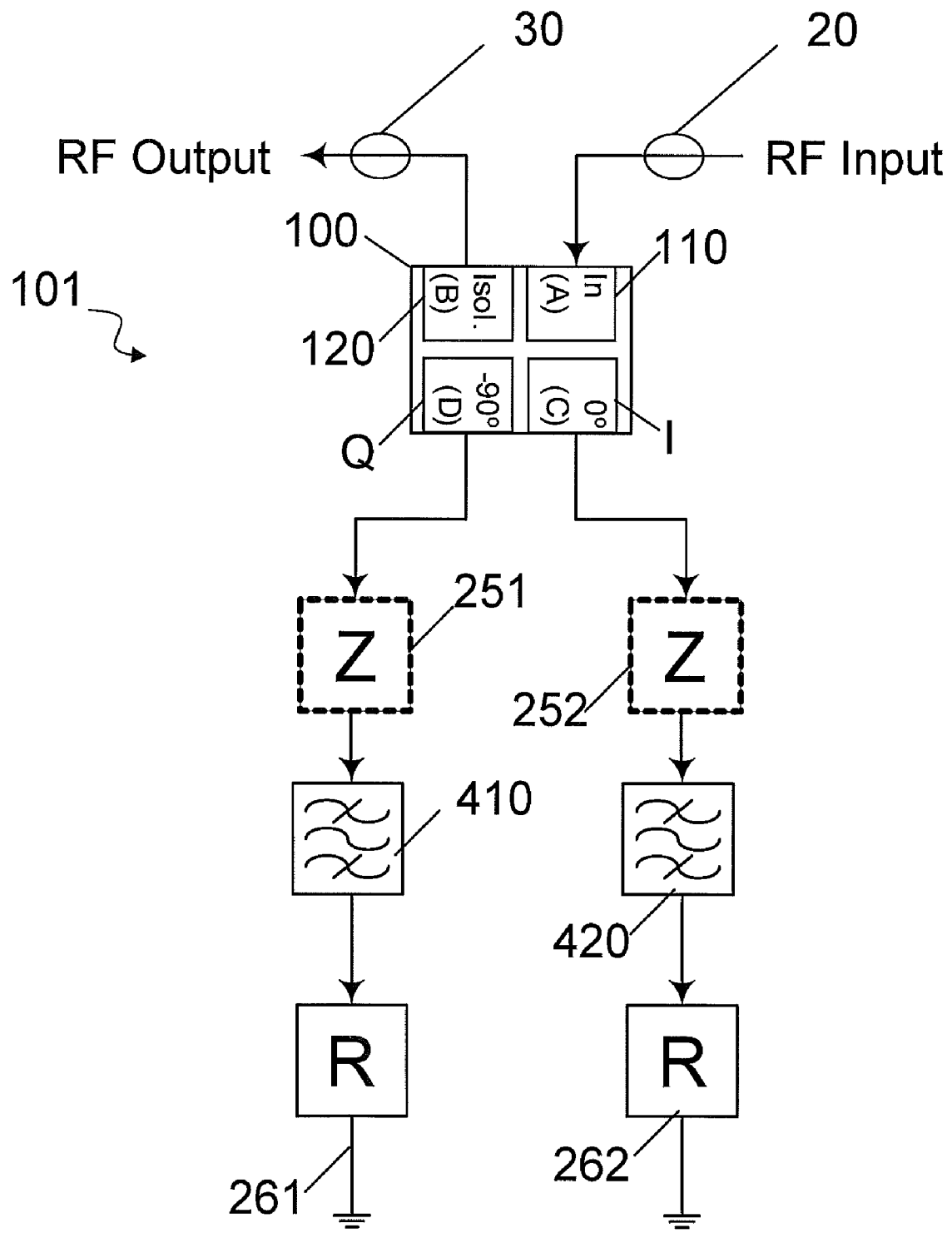
FIG. 2a shows a transforming unit according to the present disclosure.
Figure 2B:
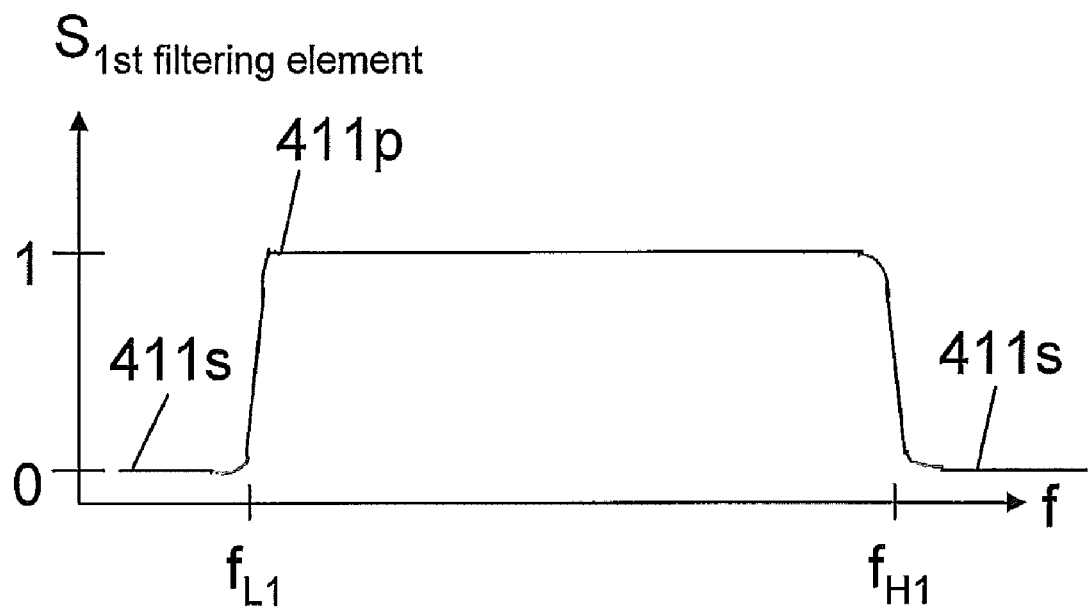
FIG. 2b shows two filtering characteristics of the first filtering element and the second filtering element.
Figure 2B:
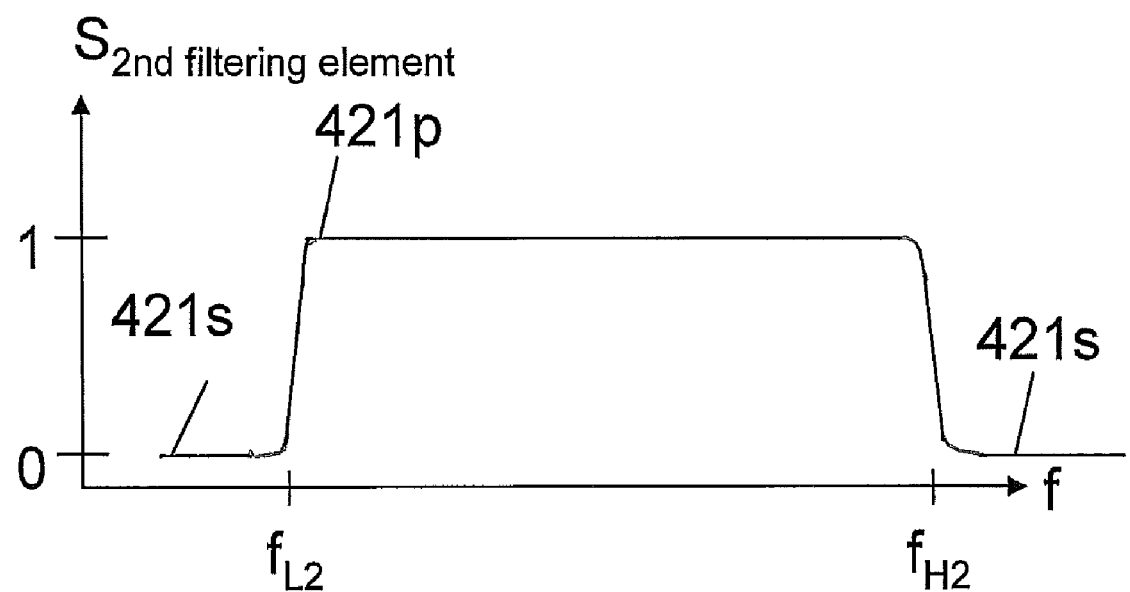
Figure 2C:
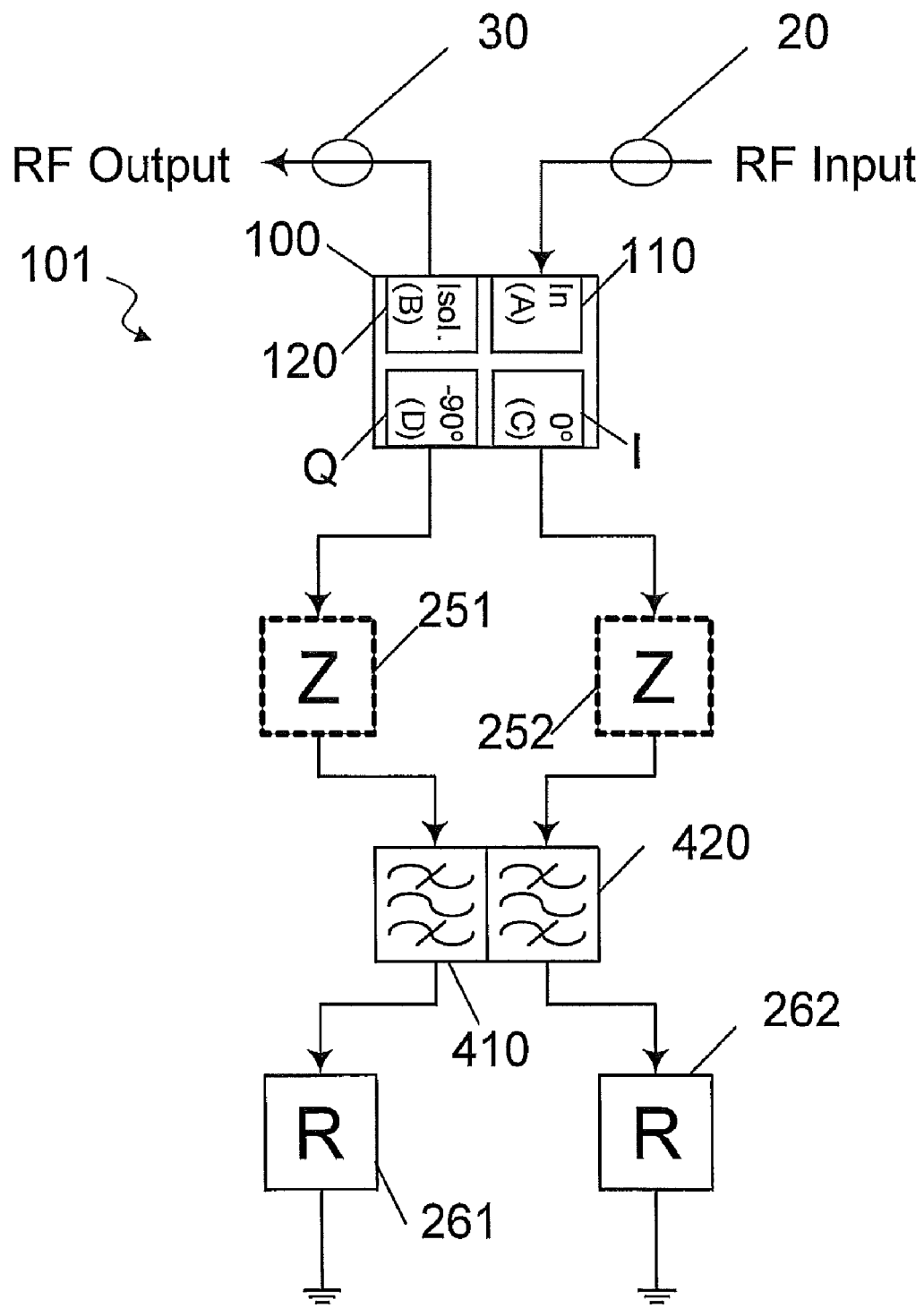
FIG. 2c shows a further example of the transforming unit according to the present disclosure.
Figure 2D:
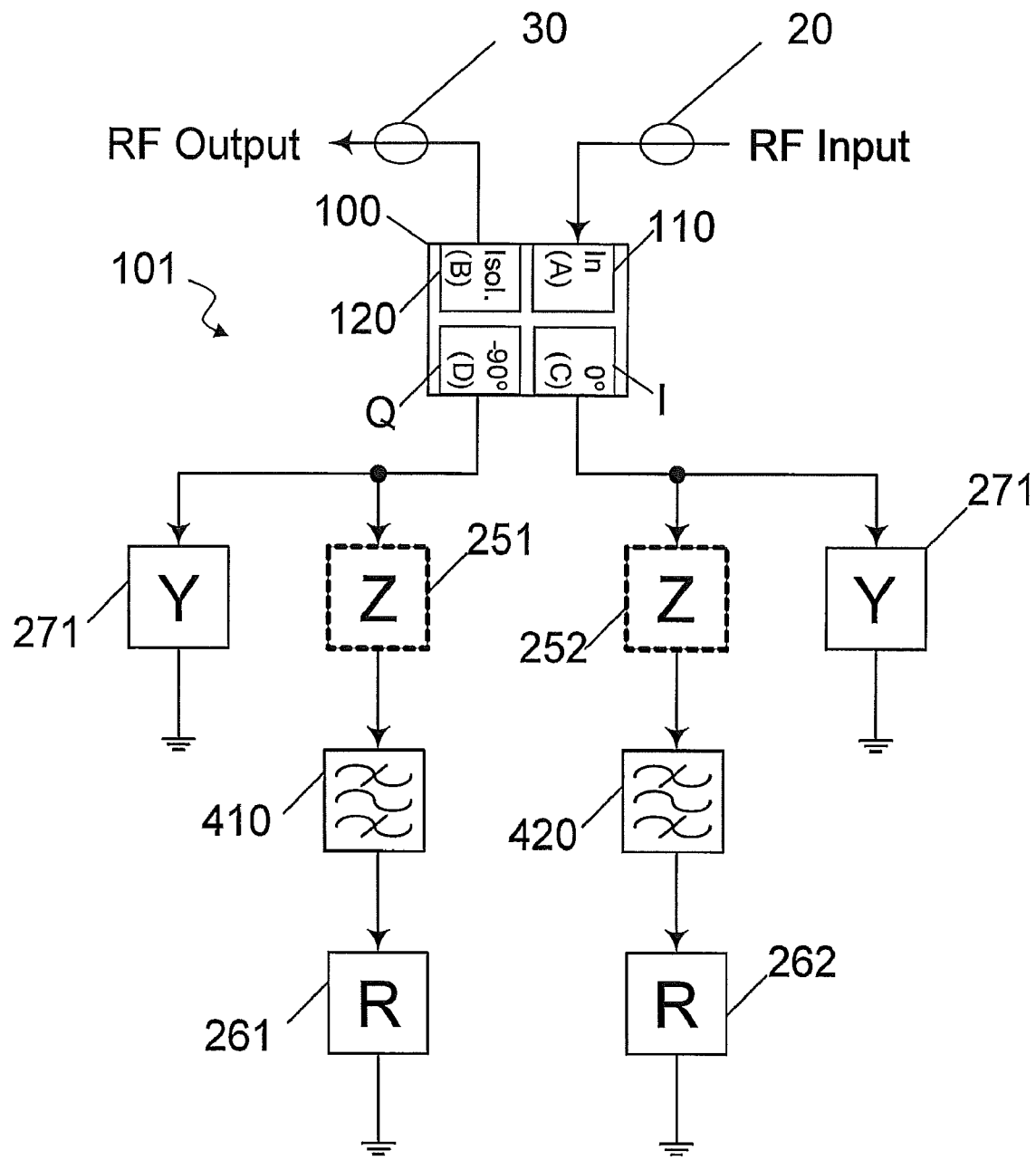
FIG. 2d shows the transforming unit comprising auxiliary matching networks.
Figure 2E:
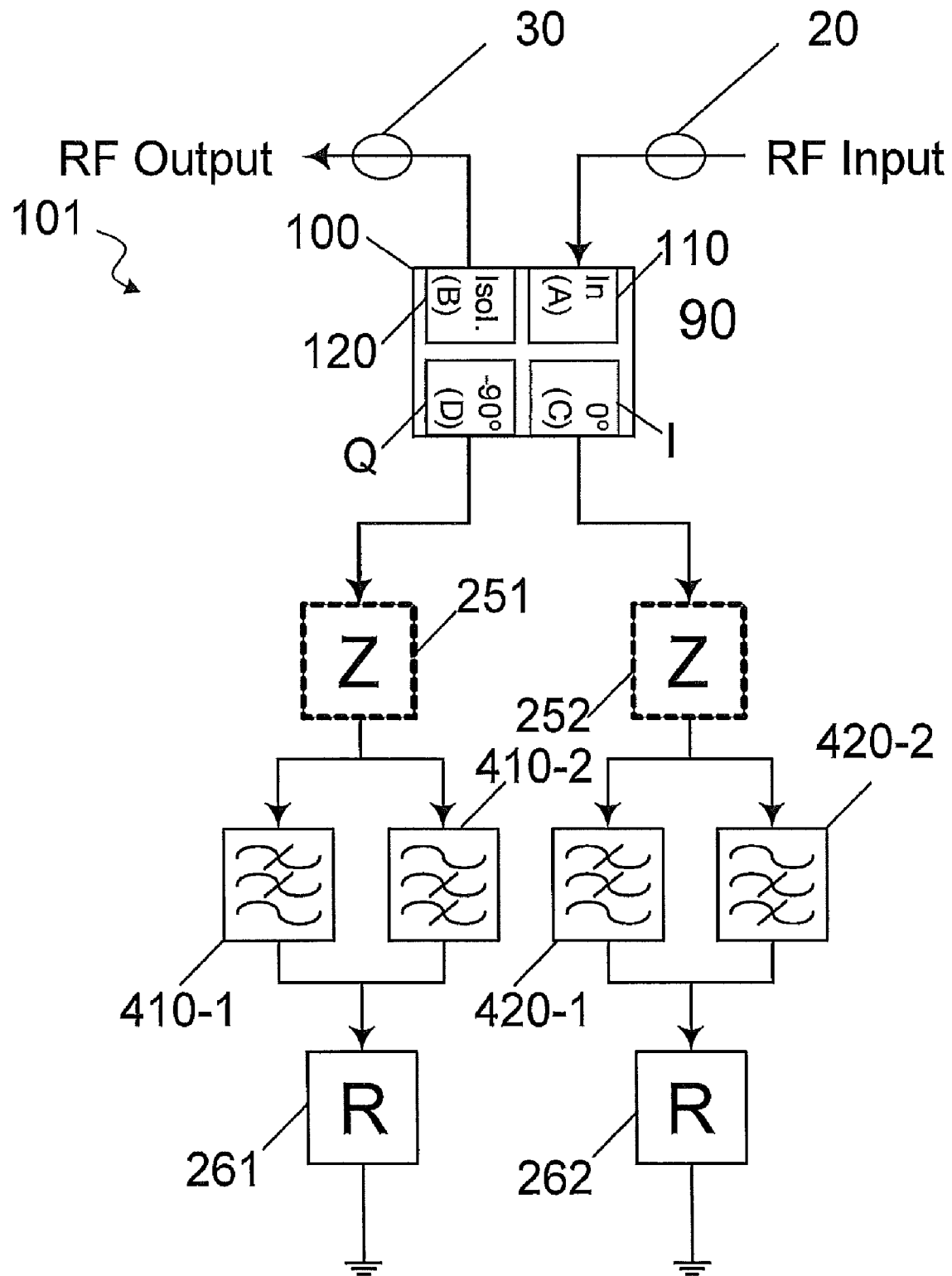
FIG. 2e shows an example of the transforming unit with the first filtering element and the second filtering element comprising combined low-pass and high-pass filters.

FIG. 2*e* shows another example of the transforming unit 101. Within FIG. 2*e* the first filtering element 410 (see for example FIG. 2*a*) has been split into a first component 410-1 of the first filtering element 410 and a second component 410-2 of the first filtering element 410. Likewise the second filtering element 420 has been split into a first component 420-1 and a second component 420-2 of the second filtering element 420.

Let us consider the first filtering element 410 first. The use of the first component 410-1 and the second component 410-2 of the first filtering element 210 may be of interest in order to form a broad filtering characteristic spanning pass bands and/or stop bands over relatively wide frequency ranges. It is known in the art to form broad filtering characteristics by implementing a combination of the first component 410-1 and the second component 410-2 of the first filtering element 410. Likewise, using the first component 420-1 and the second component 420-2 of the second filtering element 410 allows implementing very broad filtering characteristics. Using the first components 410-1, 420-1 and the second components 410-2, 420-2 allows the formation of a band pass or a band stop. Whether the band pass or the band stop is formed, depends on a roll-off of the first component 410-1 of the first filtering element 410 and the second component 410-2 of the first filtering element 410. It is possible to set up a band pass filter and/or a band stop filter by selecting low pass filtering elements and high pass filtering elements. The setup of the band pass filter and/or the stop pass filter depends on the roll-off of each one of the first component 420-1 and the second component 420-2. The filtering characteristic of the first components 410-1, 420-1 and the second components 410-2, 420-2 should be substantially identical in order to provide a good effective filtering characteristic. All remaining features of FIG. 2*e* have been discussed previously and are referred to by using identical reference numbers.

Figure 2F:
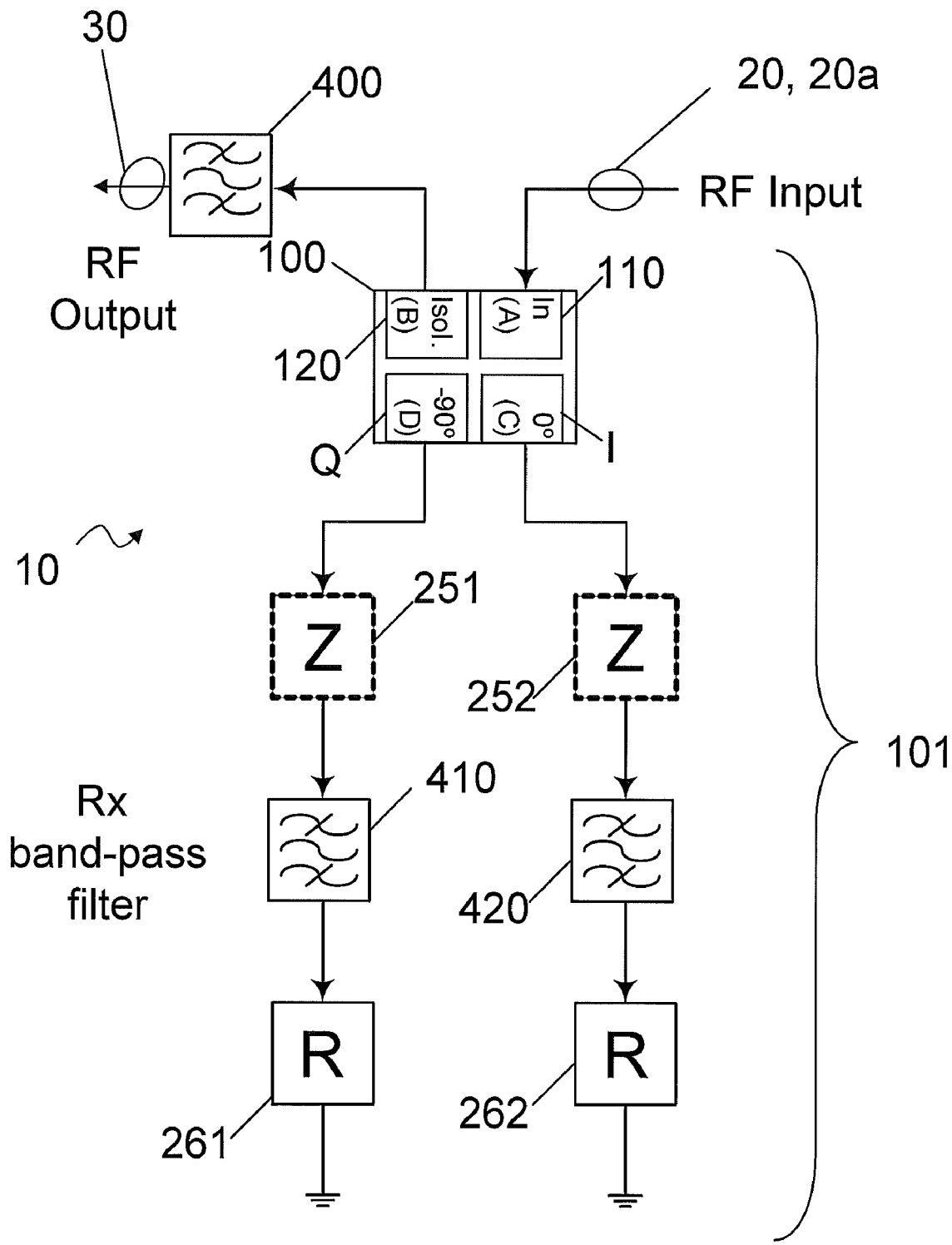
FIG. 2f shows the filtering device.

FIG. 2*f* shows an aspect of the filtering device 10 according to the present disclosure. In FIG. 2*f* the transforming unit 101 replaces the circulator (see FIG. 1*c*). In FIG. 2*f* the complementary filtering unit 400 comprising the complementary filtering characteristic with at least one complementary stop band 400*s* and at least one complementary pass band 400*p* is provided at the output 120 of the analogue quadrature splitter 100. It is to be understood that the transforming unit 101 transforms, for example, the band-pass filtering characteristic of the first filtering element 410 and the second filtering element 420 into a transformed band-stop filtering characteristic as explained with respect to FIG. 1*f*. Therefore it is possible to use band-pass filtering elements for the first filtering elements 410, the second filtering elements 420 and also for the complementary filtering unit 400 in order to design a filtering characteristic comprising the effective pass band 300*p* and the complementary stop band 400*s*.

It is to be understood that the effective pass band 300*p* may comprise more than one pass band. The complementary filtering characteristic may comprise more than one stop band 400*s* and more than one pass band 400*p*. As mentioned previously the first filtering element 410 and the second filtering element 420 may comprise substantially identical filtering characteristics with a substantially identical response to the temperature changes. The fact that the first filtering element 410, the second filtering element 420 and the complementary filtering unit 400 may be implemented as, for example, band-pass filtering elements allows a design of an effective filtering characteristic comprising both the transformed filtering characteristic of the first filtering element 410 and the second filtering element 420, now being in the form of an effective band stop 300*s* in combination with the at least one pass band 400*p*. It is possible to design an effective filtering characteristic comprising the effective stop band 300*s* closely-spaced to the complementary pass band 400*p*. Due to the identical design of the first filtering element 410, the second filtering element 420 and the complementary filtering unit 400, for example as band-pass filtering elements, the response to the temperature changes will be substantially identical not only for the first filtering element 410 and the second filtering element 420 but also for the complementary filtering unit 400. As depicted in FIG. 2*f*, the first filtering element 410 and the second filtering element 420 may comprise a band-pass filter allowing radio frequency signals within a receive band Rx to pass the first filtering element 410 and the second filtering element 420. As explained previously, the first filtering elements 410 and the second filtering elements 420 in the transforming unit 101 will generate the effective band stop 300*s* within the receive band Rx. Moreover, the complementary filtering unit 400 may allow a transmit signal Tx to pass the complementary filtering unit 400. Conversely, the complementary filtering unit 400 may also comprise an Rx-band band-pass filter, and the first filtering element 410 and the second filtering element 420 in turns comprising a Tx-band band-pass filtering element.

Figure 2G:
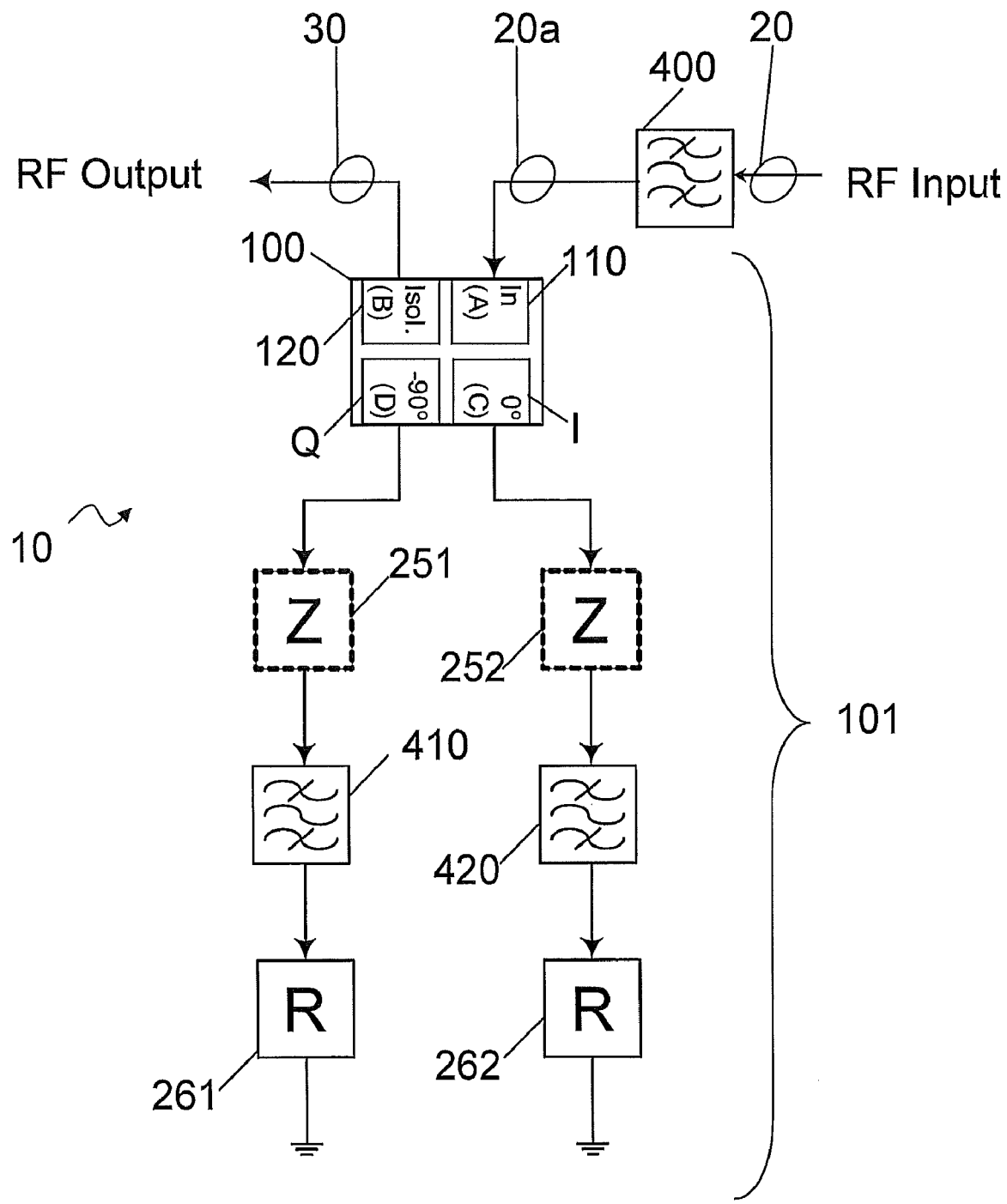
FIG. 2g shows a variant of the filtering device.

FIG. 2*g* shows a further alternative of the filtering device 10 according to the present disclosure. Different to FIG. 2*f* the complementary filtering unit 400 has been moved from a position downstream of the output 120 of the analogue quadrature splitter 100 to a position upstream of the input 110 of the analogue quadrature splitter 100. Again, the complementary filtering unit 400 comprises a transmit-band band-pass filter. The first filtering element 410 and the second filtering element 420 comprise Rx-band band-pass filters. The effective filtering characteristic will comprise a pass band for the transmit signal Tx within the transmit band and a stop band 300s within the Rx-band. Therefore the signal components of the input signal 20 comprising the transmit signal Tx within the Tx-band will pass the filtering device 10, whereas the signal components of the RF signal pertaining to the receive band Rx will be filtered. Without any limitation the complementary filtering unit 400 may comprise a band pass for the receive band Rx and the first filtering element 410 and the second filtering element 420 may comprise a band pass within the transmit band Tx. In such a situation, the signal components within the receive band Rx will be forwarded by the filtering device 10, whereas signal components within the transmit band Tx will be filtered. The filtering device 10 is therefore adapted to selectively filter the transmit signal Tx or the receive signal Rx, as shall be explained next.

Figure 3:
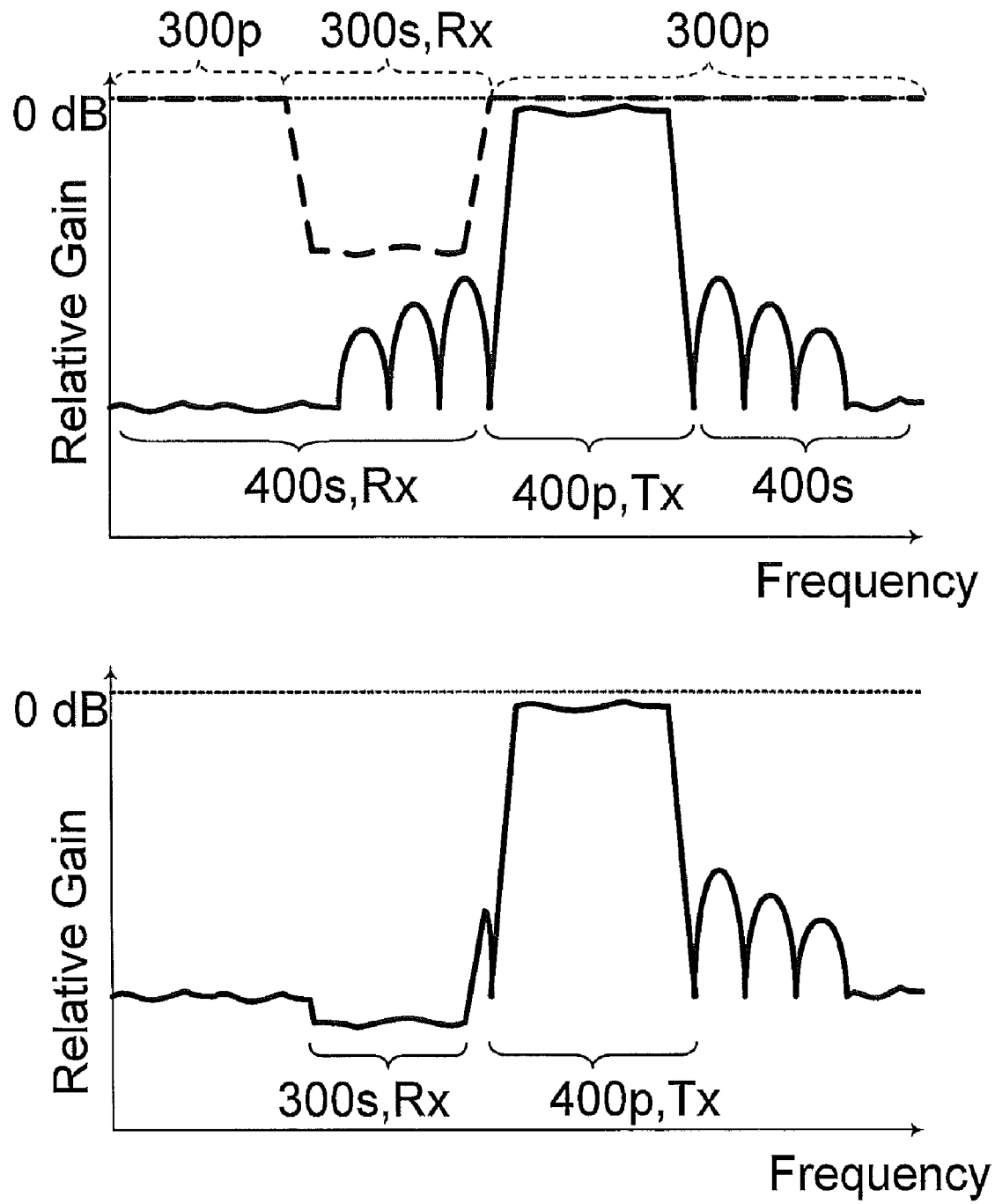
FIG. 3 shows a transfer function of the filtering device.

FIG. 3 shows how the filtering characteristics of the first filtering element 410 and the second filtering element 420 (dotted lines) combine with the complementary filtering characteristic (solid lines) of the complementary filtering unit 400 on a frequency scale. For the setup of the filtering device 10 as depicted in FIGS. 2f and 2g the pass bands 411p of the first filtering element 410 and the pass bands 421p of the second filtering element 420 are transformed into at least one effective stop band 300s in the range of the receive band Rx. The receive band Rx is closely-spaced in frequency to the complementary pass band 400p of the complementary filtering unit 400. To the left and the right of the complementary pass band 400p a ripple can be observed in the filtering characteristic of the complementary filtering unit 400. The ripple within the complementary filtering characteristic would allow some signal components from outside the transmit band Tx to pass the complementary filtering unit 400 when used alone. The transformed filtering characteristic of the first filtering element 210, 410 and the second filtering element 420 comprises the effective pass band 300p closely-spaced to the receive band Rx (left and right from the receive band Rx) and the effective stop band 300s within the receive band Rx. Therefore the first filtering element 210, 410 and the second filtering element 420 in the transforming unit 101 help to suppress the additional ripple present in the filtering characteristics of the complementary filtering unit 400 alone, closely-spaced to the transmit band Tx.

A lower half of FIG. 3 shows a combined filtering characteristic (overall filtering characteristic) provided by the filtering device 10 according to the present disclosure. The signal components within the receive band Rx are sufficiently suppressed, while the transmit signal Tx within the transmit band is forwarded without an impinging of the effective stop band 300s in the region of the receive band Rx. Therefore an isolation of the transmit signal Tx is possible. The filtering device 10 may also be designed such that the receive signal Rx within the receive band is forwarded by the filtering device 10 while signal components within the transmit band are effectively suppressed.

In the case where the transmit band(s) Tx and the receive band(s) Rx are closely-spaced it is of interest to provide the first filtering element 210, 410 and the second filtering element 420 with a substantially identical response to the temperature changes in comparison to the complementary filtering unit 400. For the performance of the transforming unit 101 it is of interest to provide the first filtering element 410 and the second filtering element 420 of substantially identical filtering characteristic. The response to the temperature changes will hence be also substantially identical for the first filtering element 410 and the second filtering element 420 in order to achieve a good performance of the transforming unit 101 as discussed with respect to FIG. 2b.

The filtering device 10 according to the present disclosure allows for the first filtering elements 210, 410, the second filtering element 420 and the complementary filtering unit 400 to be of a similar or identical design in order to meet a combined filtering characteristic as is shown in the lower half of FIG. 3. If the first filtering element 410 and the second filtering element 420 are of substantially identical design to the complementary filtering unit 400 (but centred on a different frequency), it is possible to achieve a substantially identical response to the temperature changes for all of the first filtering element 210, 410, the second filtering element 420 and the complementary filtering unit 400. If the first filtering element 210, 410, the second filtering element 420 and the complementary filtering unit 400 all form, for example, band-pass filters, the filtering characteristics may be selected such that poles and zeros of the filtering characteristics are, respectively, equal in number and are equally spaced for all of the filtering elements.

The first filtering elements 210, 410, the second filtering element 420 and the complementary filtering unit 400 may further be based on the same filtering technology, such as surface acoustic wave (SAW) filtering devices comprising identical responses to the temperature changes. It is conceivable to provide the first filtering elements 210, 410, the second filtering element 420 and the complementary filtering unit 400 in the same package as was discussed with respect to FIG. 2c. It will be appreciated that the filtering device 10 of the present disclosure provides a more reliable response to temperature changes for the filtering device 10 and hence provides a more reliable way of isolating one signal out of closely-spaced signals.

Figure 4A:
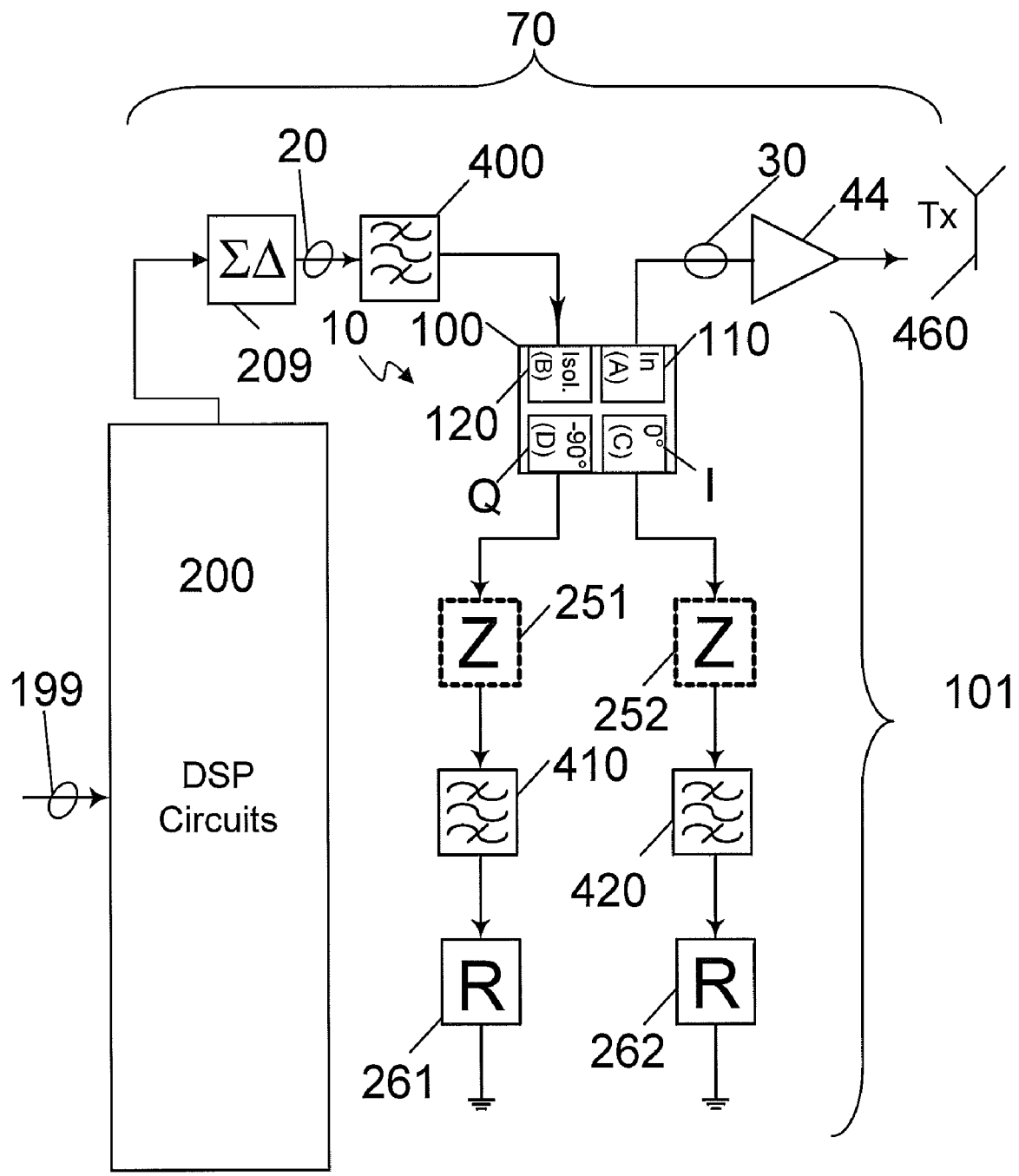
FIG. 4a shows an aspect of the filtering device.

FIG. 4a shows a first example to incorporate the filtering device 10 in a transmit path 70 of a radio system. The radio system comprises digital signal processing (DSP) circuits 200 and at least one transmit path 70. There may be more than one of the transmit paths 70. For the sake of clarity only one of the transmit paths 70 is shown. A payload signal 199 is forwarded to the DSP circuits 200. Typically the payload signal 199 is provided at base band. Alternatively the payload signal 199 may be at an intermediate frequency band IF between the base band frequency and a frequency of transmission of the radio system. The payload signal 199 is provided in a digital format and forwarded to a digital-to-analogue converter 209, for example, a sigma-delta digital-to-analogue convertor. Upstream of the digital-to-analogue convertor 209 the filtering unit 10 is inserted into the transmit path 70. The complementary filtering unit 400 in FIG. 4a is a Tx band-pass filter. The first filtering element 410 and the second filtering element 420 in FIG. 4a are Rx band-pass filters. The overall filtering characteristic of the filtering device 10 of FIG. 4a corresponds to the overall filtering characteristic as depicted in FIG. 3, lower half. It is to be understood that the input signal 20, comprising an analogue version of the payload signal 199, is forwarded as the transmit signal Tx to an antenna element 460. Only components of the input signal 20 within the transmit band of the radio system will be forwarded to the antenna element 460. The filtering unit 10 as depicted in FIG. 4a may help to reduce any noise introduced by the digital-to-analogue converter 209, as is known for sigma-delta digital-to-analogue converters.

Figure 4B:
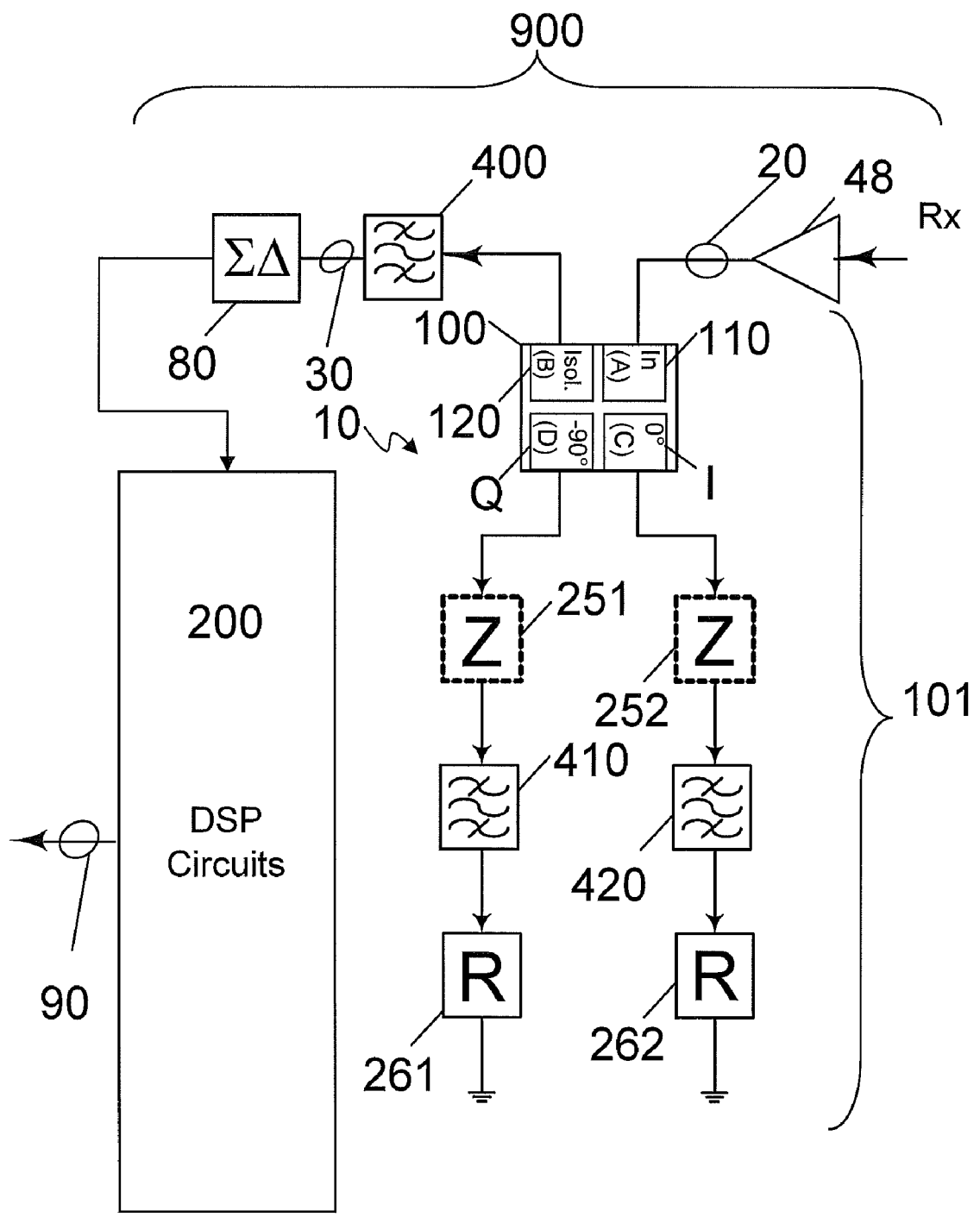
FIG. 4b shows a further aspect of the filtering device.

The filtering device 10 of the present disclosure is not limited to a use within the transmit path 70 of the radio system. FIG. 4b shows an example of the filtering device 10 being placed in a receive path 900 of the radio system. The receive signal Rx within a receive band is amplified by a receive amplifier 48 and forms the input signal 20 of the filtering device 10. The complementary filtering unit 400 comprises a band-pass filtering element within the receive band. Therefore the effective filtering characteristic 300 comprises a pass band 300$p$ in the range of the receive band. The first filtering element 410 and the second filtering element 420 may be chosen as a band-pass filter in a frequency band closely-spaced to the Rx-band. The filtering characteristic of the first filtering element 410 and the second filtering element 420 are transformed by the transforming unit 101 as explained previously such that effective stop bands 300$s$ are present within the effective filtering characteristics. The effective stop band(s) 300$s$ is (are) in the frequency band closely-spaced to the receive band and will block any signal components outside the receive band Rx. Such a blocking behaviour is of interest in order to reduce any signal components from outside the receive band in the receive signal Rx.

In modern telecommunication it is of interest to suppress any blocker signals or any RF signals from a closely-spaced channel before the Rx signal is being analogue-to-digital transformed by the analogue-to-digital converter 80. If components of the Rx signals outside the receive band were not suppressed, a dynamic range of the analogue-to-digital converter 80 may not be used most efficiently, in particular with the signal components outside the receive band being of an amplitude comparable to, or even substantially higher than, the wanted receive signal. The output port of the filtering device 10 is an output of the complementary filtering unit 400 providing the output signal 30. The output signal 30 will only allow signal components within the receive band to pass the filtering device 10. As mentioned previously any signal components within closely-spaced frequency bands will be suppressed.

The filtering device 10 according to the present invention is not limited to mobile communication systems. The filtering device 10 is adapted for any application wherein two different signals within closely-spaced frequency bands, such as for example the transmit band Tx and the receive band Rx need to be isolated. The receive path 900 in FIG. 4$b$ is terminated by the DSP circuits 200 generating an output signal 90. Typically the output signal 90 is provided in the base band. As for the payload signal 199 of the transmit case shown in FIG. 4$a$, the receive signal 90 may be provided in any intermediate frequency band IF.

Figure 5A:
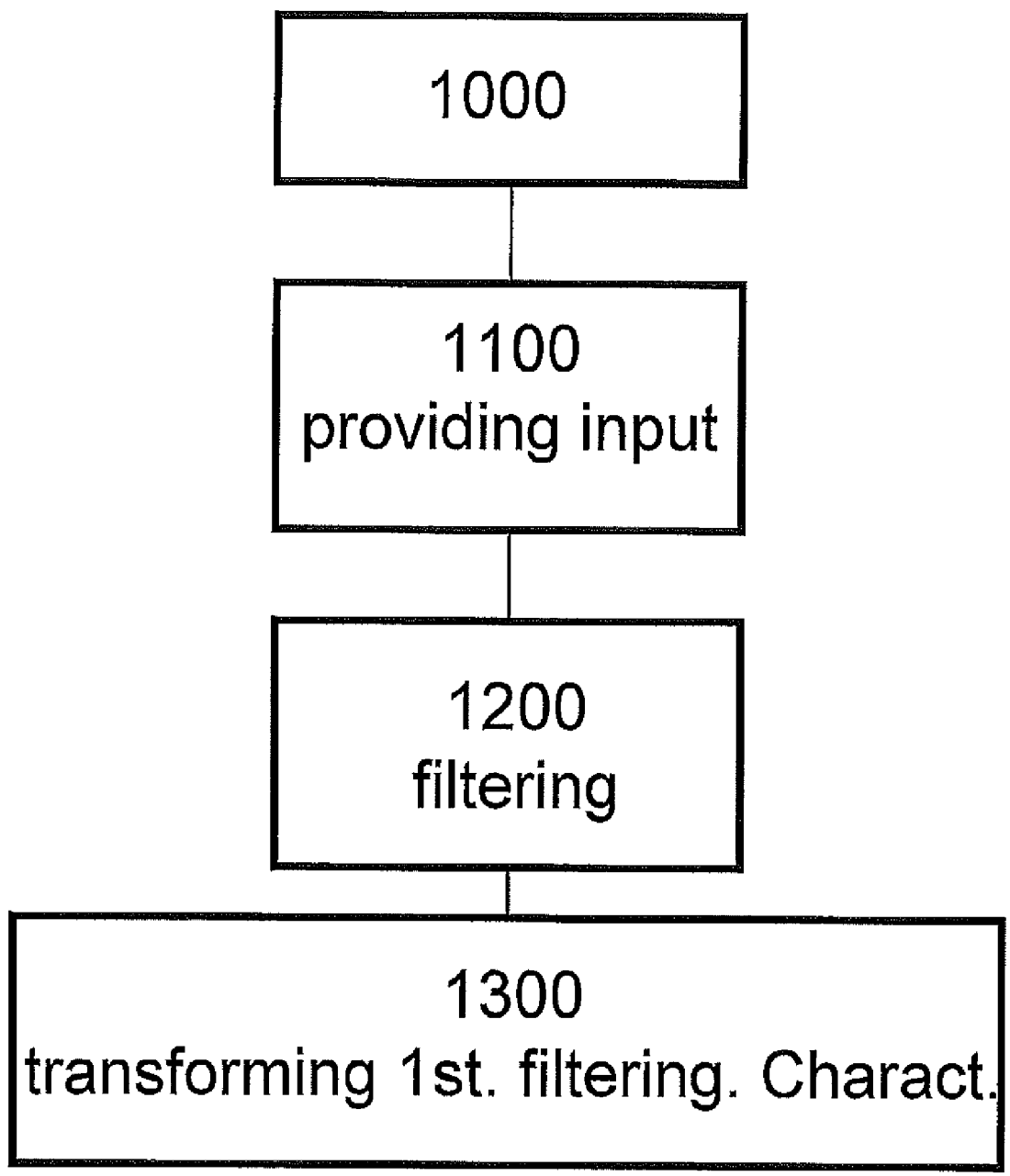
FIG. 5a shows a diagram of a method of filtering.
Figure 5B:
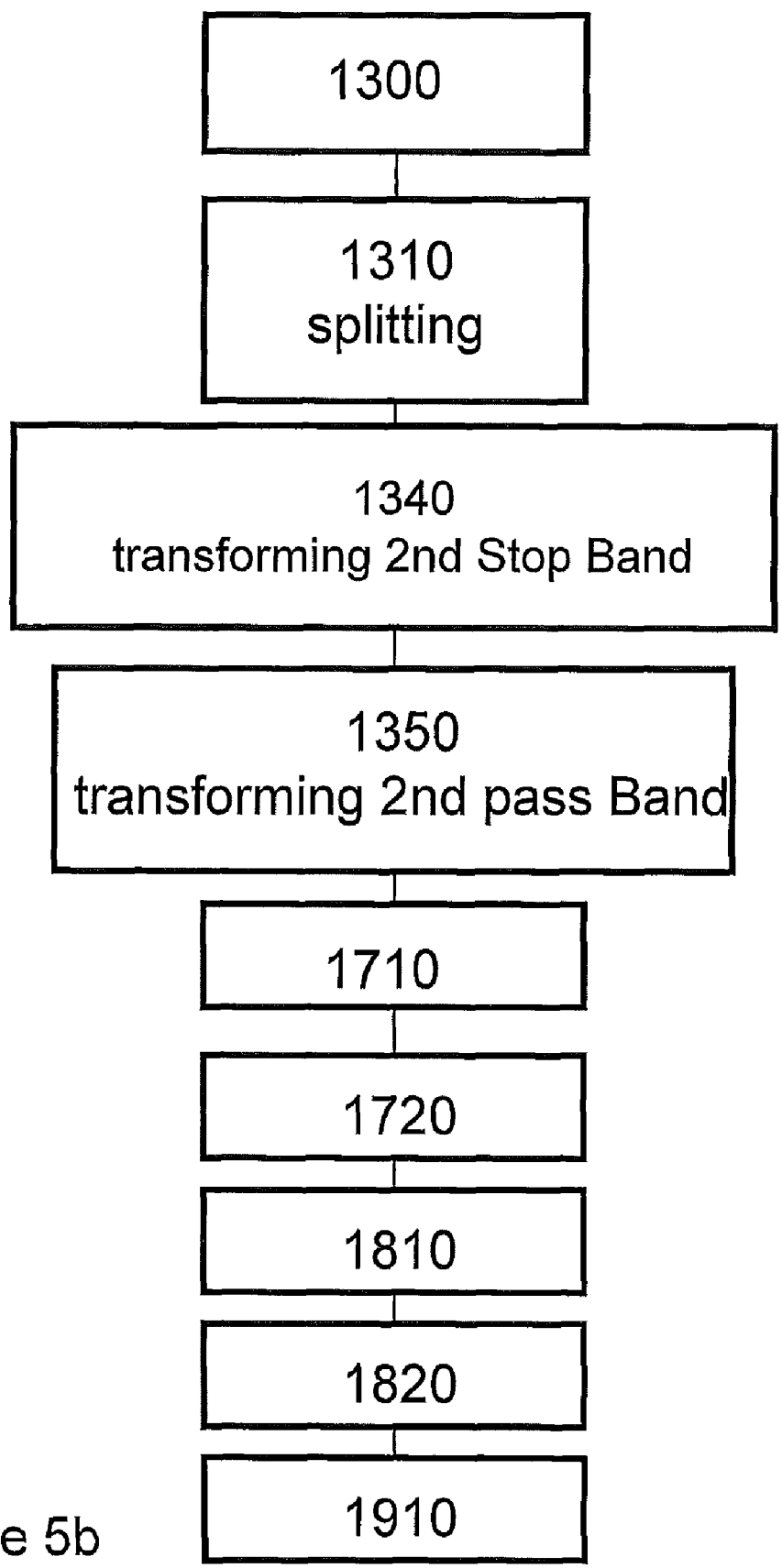
FIG. 5b shows details of a transforming of filtering characteristics.

The present disclosure further provides a method for filtering an input signal 20. FIG. 5$a$ shows a diagram of the method 1000. The method comprises a step 1100 of providing an input signal 20. The method further comprises a step 1200 of filtering the input signal 20 according to a complementary filtering characteristic. The complementary filtering characteristic comprises at least one complementary pass band 400$p$ and the complementary filtering characteristic further comprises at least one complementary stop band 400$s$ (see for example FIG. 3). The complementary filtering characteristic may be provided by the complementary filtering unit 400.

In a step 1300 a process of substantially transforming at least a first filtering characteristic comprising at least a first pass band 211$p$, 411$p$ and at least a first stop band 211$s$, 411$s$ into an effective filtering characteristic is provided. The first filtering characteristic may be provided by the first filtering element 210, 410. In the step 1300 of the substantially transforming process, a stop band is substantially transformed into a pass band and a pass band is substantially transformed into a stop band. When using the filtering device 10 with the transforming unit 101 being the circulator the method 1000 may already be finished.

FIG. 5$b$ provides details of the step 1300 of the substantially transforming process. The steps shown in FIG. 5$b$ are of interest in combination with the transforming unit 101 comprising the analogue quadrature splitter 100. A step 1310 comprises a splitting of an input signal 20, more precisely the transforming input signal 20$a$ (see FIGS. 2$f$, 2$g$) into an in-phase component I and a quadrature component Q. The transforming input signal 20$a$ is the RF signal reaching the transforming unit 101. In FIG. 1$c$ this is the input signal 20 reaching the input 110 of the circulator as the transforming unit 101. In FIG. 2$f$ the transforming input signal 20$a$ is identical with the input signal 20. In FIG. 2$g$ the input signal 20 becomes the transforming input signal 20$a$ after having passed the complementary filtering unit 400.

In a step 1340 at least one second stop band 421$s$ is substantially transformed into at least one effective pass band 300$p$. The at least one second stop band 421$s$ may be provided by the second filtering element 420. The transforming of filtering characteristics has been explained with respect to FIGS. 1$f$-1$g$.

In a step 1350 a process of substantially transforming at least one second pass band 421$p$ of the second filtering element 420 into the at least one effective stop band 300$s$ is carried out.

An optional step 1710 of impedance matching the in-phase component I is of interest when using the transforming unit 101 as depicted in FIGS. 2$a$, 2$c$-2$g$ and FIGS. 4$a$ and 4$b$. Likewise an optional step 1720 comprises an impedance matching 1720 of the quadrature component Q.

In a step 1810 the in-phase component I is terminated into a load. The load may, for example, be the second load 262 in FIG. 2$a$. In a step 1820 the quadrature component Q is terminated into a first load 261.

In an optional step 1910 an attenuation of the at least one effective stop band 300$s$ may be increased. The increasing 1910 of the attenuation may be achieved using the auxiliary matching network 271 as depicted in FIG. 2$d$.

The present disclosure provides a computer program product comprising executable instructions for a processor, enabling the processor to carry out a manufacture of the filtering device 10 of the present disclosure.

Furthermore the present disclosure provides a computer program product comprising executable instructions for a processor, enabling the processor to carry out the method 1000 of filtering. It will be appreciated by a person skilled in the art that all those aspects of the disclosure described herein as an apparatus may at least partly be incorporated as software. The method as described herein may without limitation be implemented as a computer program and/or dedicated hardware to carry out the method. Changing from a method to a computer program and/or a dedicated piece of hardware does not depart from the spirit of the present disclosure.

While various embodiments of the present disclosure have been described above, it should be understood that they have been presented by way of example, and not limitation. It will be apparent to persons skilled in the relevant arts that various changes in form and detail can be made therein without departing from the scope of the disclosure. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present disclosure may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present disclosure should not be limited by any of the above-described exemplary embodiments, but should be defined only in accordance with the following claims and their equivalents.

The invention claimed is:

1. A filtering device comprising:
a first filtering element having a first filtering characteristic with at least a first pass band and at least a first stop band;
a complementary filtering unit with a complementary filtering characteristic comprising at least one complementary pass band and at least one complementary stop band;
a transforming unit adapted to substantially transform at least the first filtering characteristic of the first filtering element into an effective filtering characteristic with at least one effective pass band and at least one effective stop band,
wherein the effective filtering characteristic and the complementary filtering characteristic
are closely spaced in frequency, and
combine to provide an overall filtering characteristic of the filtering device and
wherein a response to temperature changes of the first filtering element is substantially identical to a response to temperature changes of the complementary filtering unit.

2. The filtering device according to claim 1, wherein the overall filtering characteristic affects an output signal at an output of the filtering device in response to an input signal at an input of the filtering device.

3. The filtering device according to claim 1, wherein the complementary filtering unit is a surface acoustic wave filtering element.

4. The filtering device according to claim 1, wherein the transforming unit is a circulator.

5. The filtering device according to claim 1, further comprising a second filtering element with a second filtering characteristic comprising at least a second pass band and at least a second stop band;
wherein the transforming unit comprises an analogue quadrature splitter for splitting an input signal into an in-phase component and a quadrature component;
wherein the transforming unit is adapted to substantially transform at least one of the at least one first pass band and the at least one second pass band into the at least one effective stop band; and
wherein the transforming unit is adapted to substantially transform at least one of the at least one first stop band and the at least one second stop band into the at least one effective pass band.

6. The filtering device according to claim 5, wherein the transforming unit is adapted to substantially transform at least one of
the first filtering characteristic comprising a first band pass and
the second filtering characteristic comprising a second band pass into at least one effective band stop.

7. The filtering device according to claim 5, wherein the transforming unit is adapted to substantially transform at least one of
the first filtering characteristic comprising a first band stop and
the second filtering characteristic comprising a second band stop into at least one effective band pass.

8. The filtering device according to claim 5, wherein the first filtering characteristic and the second filtering characteristic are substantially identical.

9. The filtering device according to claim 8, wherein the first filtering element and the second filtering element comprise a substantially identical response to temperature changes.

10. The filtering device according to claim 5, further comprising
a first impedance matching network coupled to the first filtering element;
a second impedance matching network coupled to the second filtering element.

11. The filtering device according to claim 5, further comprising:
a first load for terminating the in-phase component; and
a second load for terminating the quadrature component.

12. The filtering device according to claim 5, further comprising at least one auxiliary termination network adapted to increase an attenuation in the at least one effective stop band.

13. The filtering device according to claim 5, wherein the analogue quadrature splitter is implemented in at least one of strip line technology, microstrip technology, a lumped element equivalent, and a transformer-based hybrid.

14. The filtering device according to claim 1, wherein the input signal at the input is a transmit signal in a transmit path of a radio system; and wherein the transmit path is terminated by an antenna element.

15. The filtering device according to claim 14, wherein the transmit path comprises a digital-to-analogue converter upstream of the filtering device.

16. The filtering device according to claim 14, wherein the output signal is forwardable to an amplifier in the transmit path.

17. The filtering device according to claim 1, wherein the input signal at the input of the filtering device is a receive signal in a receive path of a radio system.

18. The filtering device according to claim 17, wherein the receive path comprises a receive amplifier upstream of the input.

19. The filtering device according to claim 1, wherein the first pass band is substantially closely-spaced in frequency to the at least one complementary pass band.

20. The filtering device according to claim 1, wherein the first stop band is substantially closely-spaced in frequency to the at least one complementary stop band.

21. The filtering device according to claim 1, wherein the at least one effective stop band is substantially closely-spaced in frequency to the at least one complementary pass band.

22. The filtering device according to claim 1, wherein the at least one effective pass band is substantially closely-spaced in frequency to the at least one complementary stop band.

23. A method for filtering an input signal, the method comprising:
providing an input signal;
complementary filtering the input signal according to a complementary filtering characteristic, the complementary filtering characteristic comprising at least one complementary pass band and at least one complementary stop band;
substantially transforming a first filtering characteristic with at least a first pass band and at least a first stop band into an effective filtering characteristic;
wherein the effective filtering characteristic and the complementary filtering characteristic are closely spaced in frequency, and combine to provide an overall filtering characteristic,
and wherein a step of the first filtering providing the first filtering characteristic and the step of the complementary filtering are chosen to provide substantially identical responses to temperature changes.

24. The method according to claim 23, wherein the action of substantially transforming comprises:
splitting a transforming input signal into an in-phase component and a quadrature component;
transforming at least one second stop band of a second filtering element into at least one effective pass band;
transforming at least one second pass band of the second filtering element into at least one effective stop band.

25. The method according to claim 24, comprising:
impedance matching the in-phase component; and
impedance matching the quadrature component.

26. The method according to claim 24, further comprising:
terminating the in-phase component; and
terminating the quadrature component.

27. The method according to claim 24, further comprising:
increasing an attenuation in the at least one effective stop band.

28. A computer program product embodied on a computer readable medium and the computer-readable medium comprising executable instructions for the execution of a manufacture of a filtering device, the filtering device comprising:
a first filtering element having a first filtering characteristic with at least a first pass band and at least a first stop band;
a complementary filtering unit with a complementary filtering characteristic comprising at least one complementary pass band and at least one complementary stop band;
a transforming unit is adapted to substantially transform at least the first filtering characteristic of the first filtering element into an effective filtering characteristic;
wherein the effective filtering characteristic and the complementary filtering characteristic
are closely spaced in frequency and combine to provide an overall filtering characteristic of the filtering device;
and wherein the overall filtering characteristic affects an output signal at an output of the filtering device in response to an input signal at an input of the filtering device;
and wherein a response to temperature changes of the first filtering element is substantially identical to a response to temperature changes of the complementary filtering unit.

29. A computer program product embodied on a computer readable medium and the computer-readable medium comprising executable instructions for the execution of a method for filtering an input signal, the method comprising the steps of:
providing an input signal;
filtering the input signal according to a complementary filtering characteristic, the complementary filtering characteristic comprising at least one complementary pass band and at least one complementary stop band;
substantially transforming a first filtering characteristic with at least a first pass band and at least a first stop band into an effective filtering characteristic;
wherein the effective filtering characteristic and the complementary filtering characteristic are closely spaced in frequency and combine to provide an overall filtering characteristic.

* * * * *

UNITED STATES PATENT AND TRADEMARK OFFICE
CERTIFICATE OF CORRECTION

PATENT NO.        : 8,264,298 B2                                           Page 1 of 1
APPLICATION NO.   : 12/571808
DATED             : September 11, 2012
INVENTOR(S)       : Peter Kenington It is certified that error appears in the above-identified patent and that said Letters Patent is hereby corrected as shown below:

Title Page
Item [73], replace "Unidyne Inc." with "Ubidyne Inc."

In the Specifications:

Column 8
Line 15, replace "$f_u$" with "$f_{L1}$"

Signed and Sealed this
Twentieth Day of November, 2012

David J. Kappos
*Director of the United States Patent and Trademark Office*